US010020332B2

(12) United States Patent
Harada et al.

(10) Patent No.: US 10,020,332 B2
(45) Date of Patent: Jul. 10, 2018

(54) PIXEL CIRCUIT AND IMAGING APPARATUS

(71) Applicant: SONY SEMICONDUCTOR SOLUTIONS CORPORATION, Kanagawa (JP)

(72) Inventors: Kouichi Harada, Kanagawa (JP); Toshiyuki Nishihara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/515,281

(22) PCT Filed: Jul. 10, 2015

(86) PCT No.: PCT/JP2015/069880
§ 371 (c)(1),
(2) Date: Mar. 29, 2017

(87) PCT Pub. No.: WO2016/056282
PCT Pub. Date: Apr. 14, 2016

(65) Prior Publication Data
US 2017/0229493 A1    Aug. 10, 2017

(30) Foreign Application Priority Data
Oct. 10, 2014  (JP) .................................. 2014-208785

(51) Int. Cl.
*H01L 27/14*       (2006.01)
*H01L 27/146*      (2006.01)
(Continued)

(52) U.S. Cl.
CPC .......... *H01L 27/146* (2013.01); *H01L 27/098* (2013.01); *H01L 29/808* (2013.01);
(Continued)

(58) Field of Classification Search
CPC ... H01L 27/146; H01L 27/098; H01L 29/808; H01L 31/02; H04N 5/361; H04N 5/369; H04N 5/374
See application file for complete search history.

(56) References Cited

U.S. PATENT DOCUMENTS 6,091,793 A * 7/2000 Kamashita ........... G11C 19/282
257/258
2008/0290382 A1* 11/2008 Hirota ............... H01L 27/14627
257/291
2008/0303929 A1* 12/2008 Morimoto .............. H04N 3/155
348/300

FOREIGN PATENT DOCUMENTS

JP  02-304973 A   12/1990
JP  11-017169 A   1/1999
(Continued)

OTHER PUBLICATIONS

International Search Report prepared by the Japan Patent Office dated Sep. 8, 2015, for International Application No. PCT/JP2015/069880.

*Primary Examiner* — Yosef Gebreyesus
(74) *Attorney, Agent, or Firm* — Sheridan Ross P.C.

(57) ABSTRACT

Dark current of FD is eliminated in an image sensor, and conversion efficiency of converting electric charge to voltage is improved. A pixel circuit includes a photoelectric conversion portion, a control transistor, and an electric charge accumulation portion. The photoelectric conversion portion converts light incident along an optical axis to electric charge. The control transistor controls output voltage according to input voltage. The electric charge accumulation portion accumulates electric charge in a region positioned between the control transistor and the photoelectric conversion portion on the optical axis, and supplies a voltage (Continued)

according to the amount of accumulated electric charge as the input voltage to the control transistor.

20 Claims, 37 Drawing Sheets

(51) Int. Cl.
    *H01L 27/098*     (2006.01)
    *H01L 29/808*     (2006.01)
    *H01L 31/02*     (2006.01)
    *H04N 5/361*     (2011.01)
    *H04N 5/369*     (2011.01)
    *H04N 5/374*     (2011.01)

(52) U.S. Cl.
    CPC .............. *H01L 31/02* (2013.01); *H04N 5/361* (2013.01); *H04N 5/369* (2013.01); *H04N 5/374* (2013.01)

(56) References Cited

FOREIGN PATENT DOCUMENTS

| | | |
|---|---|---|
| JP | 11-195778 A | 7/1999 |
| JP | 2005-244434 A | 9/2005 |
| JP | 2006-024686 A | 1/2006 |
| JP | 2008-294175 A | 12/2008 |
| JP | 2009-152234 A | 7/2009 |
| JP | 2011-071958 A | 4/2011 |
| WO | WO 2013/027524 A1 | 2/2013 |

\* cited by examiner

PIXEL CIRCUIT AND IMAGING APPARATUS

CROSS REFERENCE TO RELATED APPLICATIONS

This application is a national stage application under 35 U.S.C. 371 and claims the benefit of PCT Application No. PCT/JP2015/069880 having an international filing date of 10 Jul. 2015, which designated the United States, which PCT application claimed the benefit of Japanese Patent Application No. 2014-208785 filed 10 Oct. 2014, the disclosures of which are incorporated herein by reference in their entirety.

TECHNICAL FIELD

The present technology relates to a pixel circuit and an imaging apparatus. Its detail relates to a pixel circuit and an imaging apparatus for capturing an image.

BACKGROUND ART

Full digital image sensors capable of outputting digital signals directly from pixels have been proposed from the past (see, for example, patent literature 1). In these image sensors, electric charge generated by a photoelectric conversion element is transferred to and accumulated in a floating diffusion layer (FD), and a signal according to the accumulated electric charge amount of the FD is output by a source follower circuit.

CITATION LIST

Patent Literature

Patent Literature 1: JP 2011-71958A
Patent Literature 1: JP 2009-152234A

DISCLOSURE OF INVENTION

Technical Problem

However, the above image sensor needs to read 1000 times in one frame for example, and has problems of increase in read voltage and increase in read time. Also, as the number of reads per frame increases, dark current of the FD increases proportionally. As a result, the dark current of the FD becomes the main component of the dark current of the pixel. The dark current of the FD is unable to be reduced easily, and thus even if the conversion efficiency can be set to 600 μV/e−, the accuracy of detecting one photon is reduced. If there is no FD, the accuracy of detecting one photon is improved, and an example of such an image sensor not using FD is, for example, a single carrier bulk charge modulated device (BCMD) (see, for example, patent literature 2). However, in this BCMD, in order to sufficiently increase the conversion efficiency for converting electric charge to signal voltage to maintain the detection accuracy at a certain level or more, it is necessary to set the area of a control transistor for controlling an output voltage according to an input voltage from a photoelectric conversion portion that converts light incident along an optical axis to electric charge, to a predetermined area or less. In order to sufficiently increase the conversion efficiency, it is necessary to set the size of the control transistor to 0.5 micrometer (μm)×0.5 micrometer (μm) or less, for example.

However, in the structure disclosed in patent literature 2, in principle, a gate length of the control transistor is the same as a combined length of an electric charge accumulation portion and an overflow barrier. Therefore, if the length of the electric charge accumulation portion necessary for ensuring a minimum saturation electric charge amount is 0.2 micrometer (μm) and the length of the overflow barrier is 0.2 micrometer (μm), a combined length of the electric charge accumulation portion and the overflow barriers, that is, the gate length of the control transistor is required to be at least 0.6 micrometers (μm), because the overflow barriers are necessary on both sides of the electric charge accumulation portion. In addition, considering that the length of a source and a drain is required to be at least 0.15 micrometers (μm), the length of the control transistor in the gate length direction is unable to be set to 0.9 micrometers (μm) or less, thus there is a problem that it is difficult to improve the conversion efficiency to such an extent that one electron can be detected. In addition, in the case of the structure disclosed in patent literature 2, it is difficult to set the depth from the surface of the electric charge accumulation portion to, for example, 0.3 micrometers (μm) or more due to its structural limitation. Therefore, it is difficult to reduce diffusion of impurities forming a channel portion and the electric charge accumulation portion of the control transistor, and thus there is a problem that overlap of each impurity becomes very large, and if the dose amount of each impurity varies even slightly, the potential also varies largely. In addition, although the overflow barrier also serves as a reset barrier, the reset barrier needs to be formed to have a very thin width in order to achieve both a reset voltage and a saturated electric charge amount, and is susceptible to variation of a lightly-doped drain (LDD) width, and there is also a problem that, when the LDD width varies, the potential varies largely, resulting in poor robustness. And their robustness rapidly deteriorates with pixel miniaturization. Because of this, it is very difficult to miniaturize the control transistor. As described above, in the above image sensor, it is difficult to eliminate the dark current of the FD and increase the conversion efficiency.

The present technology has been created in view of the above situation, and it is an object to eliminate the dark current of the FD in the image sensor and to improve the conversion efficiency of converting the electric charge to a voltage.

Solution to Problem

The present technology has been made in order to solve the above problems. A first aspect of the present technology is a pixel circuit including: a photoelectric conversion portion that converts light incident along an optical axis to electric charge; a control transistor that controls an output voltage according to an input voltage; and an electric charge accumulation portion that accumulates electric charge in a region positioned between the control transistor and the photoelectric conversion portion on the optical axis, and supplies a voltage according to an accumulated electric charge amount as the input voltage to the control transistor. This brings about an effect that the electric charge is accumulated in the electric charge accumulation portion located between the control transistor and the above photoelectric conversion portion on the optical axis.

In the first aspect, the output voltage may be a voltage between a source and a drain of the control transistor, and the electric charge accumulation portion may accumulate the electric charge in the region positioned between the source and the drain and the photoelectric conversion portion on the optical axis. This brings about an effect that the electric charge is accumulated in the electric charge accumulation portion located between the source and the drain and the photoelectric conversion portion on the optical axis.

In the first aspect, the electric charge accumulation portion may have a larger area than the control transistor in a plane perpendicular to the optical axis. This brings about an effect that the electric charge is accumulated in the electric charge accumulation portion having a larger area than the control transistor in the plane perpendicular to the optical axis.

In the first aspect, the control transistor may be a junction field effect transistor. This brings about an effect that the output voltage is controlled by the junction field effect transistor.

In the first aspect, the control transistor may be a metal-oxide-semiconductor (MOS) field-effect transistor. This brings about an effect that the output voltage is controlled by the MOS field effect transistor.

In the first aspect, a reset transistor that sets the electric charge amount to an initial value by applying a predetermined potential to a reset gate and a reset drain provided on a plane perpendicular to the optical axis may be further included. This brings about an effect that the electric charge amount becomes the initial value by the application of a predetermined potential to the reset gate and the reset drain provided in the plane perpendicular to the optical axis.

In the first aspect, the reset gate and the reset drain may be arranged along a direction from a source of the control transistor to a drain of the control transistor. This brings about an effect that the electric charge amount becomes the initial value by the application of a predetermined potential to the reset gate and the reset drain arranged along the direction from the source of the control transistor to the drain of the above control transistor.

In the first aspect, the reset gate and the reset drain may be arranged along a direction orthogonal to a direction from a source of the control transistor to a drain of the control transistor. This brings about an effect that the electric charge amount becomes the initial value by the application of a predetermined potential to the reset gate and the reset drain arranged along the direction orthogonal to the direction from the source of the control transistor to the drain of the above control transistor.

In the first aspect, the reset gate and a channel of the control transistor may be formed according to a same impurity profile. This brings about an effect that the electric charge amount becomes the initial value by the application of a predetermined potential to the reset gate formed according to the same impurity profile as the channel of the control transistor.

In the first aspect, the reset gate may be adjacent to the electric charge accumulation portion. This brings about an effect that the electric charge amount becomes the initial value by the application of a predetermined potential to the reset gate adjacent to the electric charge accumulation portion.

In the first aspect, the control transistor may include a source and a drain, a channel provided between the source and the drain, and a channel pocket formed along a direction from the drain to the source between the source and the drain. A potential of the channel pocket may be higher than a potential of the channel. This brings about an effect that the output voltage is controlled by the control transistor in which the channel pocket is formed along the direction from the drain to the source between the source and the drain.

In the first aspect, the control transistor may include a source and a drain, a channel provided between the source and the drain, and a channel barrier formed along a direction orthogonal to a direction from the drain to the source between the source and the drain. A potential of the channel barrier may be lower than a potential of the channel. This brings about an effect that the output voltage is controlled by the control transistor in which the channel barrier is formed along the direction orthogonal to the direction from the drain to the source between the source and the drain.

In the first aspect, an electric charge accumulation portion pocket whose potential is higher than a potential of the electric charge accumulation portion may be further included. The electric charge accumulation portion pocket may be provided along a direction orthogonal to a direction from the drain to the source in a region surrounded by the electric charge accumulation portion. This brings about an effect that the electric charge is accumulated in the electric charge accumulation portion pocket in which the potential is larger than the potential of the electric charge accumulation portion.

In the first aspect, a channel of the control transistor and the electric charge accumulation portion may be separated by a barrier between the electric charge accumulation portion and the channel, to which an impurity having a smaller diffusion coefficient than an impurity of the channel is added. This brings about an effect that the channel of the control transistor and the electric charge accumulation portion are separated by the barrier between the electric charge accumulation portion and the channel.

In the first aspect, the impurity added to the barrier between the electric charge accumulation portion and the channel may be indium. This brings about an effect that the channel of the control transistor and the electric charge accumulation portion are separated by the barrier between the electric charge accumulation portion and the channel to which indium is added.

In the first aspect, the impurity added to the barrier between the electric charge accumulation portion and the channel may be arsenic. This brings about an effect that the channel of the control transistor and the electric charge accumulation portion are separated by the barrier between the electric charge accumulation portion and the channel to which arsenic is added.

A second aspect of the present technology is an imaging apparatus including: an image sensor including, with respect to each pixel, a photoelectric conversion portion that converts light incident along an optical axis to electric charge, a control transistor that controls an output voltage according to an input voltage, and an electric charge accumulation portion that accumulates electric charge in a region positioned between the control transistor and the photoelectric conversion portion on the optical axis and supplies a voltage according to an accumulated electric charge amount as the input voltage to the control transistor; and a signal processing unit that processes an electric signal of the output voltage. This brings about an effect that the electric charge is accumulated in the electric charge accumulation portion located between the control transistor and the photoelectric conversion portion on the optical axis.

Advantageous Effects of Invention

According to the present technology, it is possible to obtain an excellent effect that the dark current of the FD in the image sensor is eliminated, and that the conversion efficiency of converting the electric charge to a voltage can be improved. Note that effects described herein are not necessarily limitative, and any of effects described in the present disclosure may be exhibited.

MODE(S) FOR CARRYING OUT THE INVENTION

In the following, modes for carrying out the present technology (hereinafter referred to as embodiments) will be described. The description will be given in the following order.
1. First embodiment (an example in which an electric charge accumulation portion is provided between a JFET control transistor and a photoelectric conversion portion)
2. Second embodiment (an example in which an electric charge accumulation portion is provided between a JFET control transistor and a photoelectric conversion portion in order to reset in a channel width direction)
3. Third embodiment (an example in which an electric charge accumulation portion is provided between a MOS control transistor and a photoelectric conversion portion)
4. Fourth embodiment (an example in which an electric charge accumulation portion is provided between a MOS control transistor and a photoelectric conversion portion in order to reset in the channel width direction)

1. First Embodiment

Configuration Example of Imaging Apparatus

Figure 1:
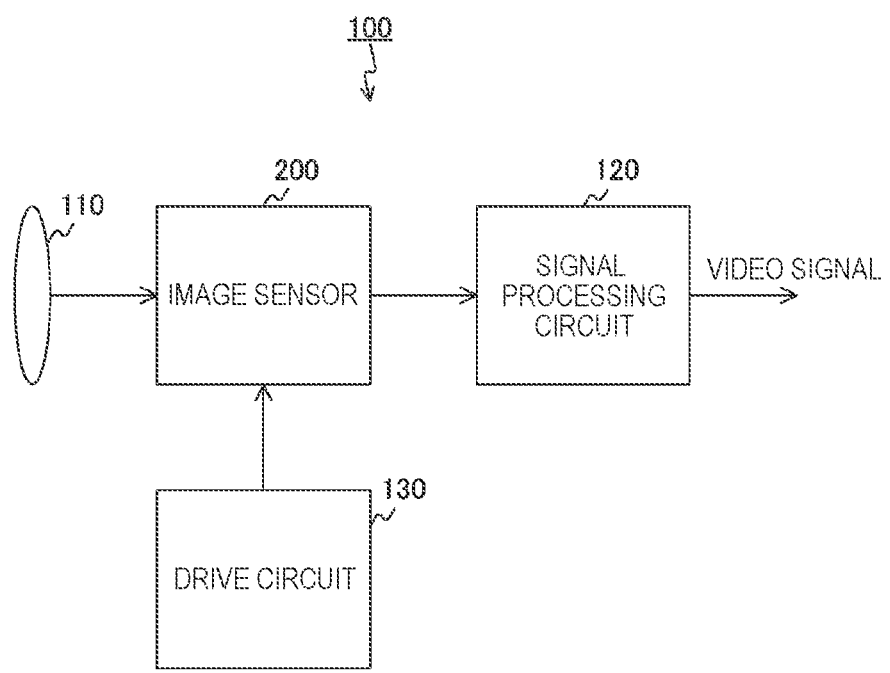
FIG. 1 is an example of an overall view of an imaging apparatus according to a first embodiment.

FIG. 1 is an example of an overall view of an imaging apparatus 100 according to a first embodiment. As illustrated in FIG. 1, the imaging apparatus 100 includes an image sensor 200. Also, the imaging apparatus 100 includes an optical system that directs incident light to a pixel region of this imaging device 410 (forms a subject image), e.g. a lens 110 that causes the incident light (image light) to form an image on an imaging surface. Furthermore, the imaging apparatus 100 includes a driving circuit 130 that drives the imaging device 410, and a signal processing circuit 120 that processes an output signal of the image sensor 200.

The driving circuit 130 includes a timing generator (not depicted) for generating various timing signals including a start pulse and a clock pulse for driving a circuit in the image sensor 200, and drives the image sensor 200 with a predetermined timing signal.

Also, the signal processing circuit 120 performs predetermined signal processing to an output signal of the image sensor 200. An image signal processed by the signal processing circuit 120 is recorded in a recording medium such as a memory, for example. The image information recorded in the recording medium is hard copied by a printer or the like. Also, the image signal processed by the signal processing circuit 120 is displayed as a moving image on a monitor composed of a liquid crystal display or the like.

Configuration Example of Image Sensor

Figure 2:
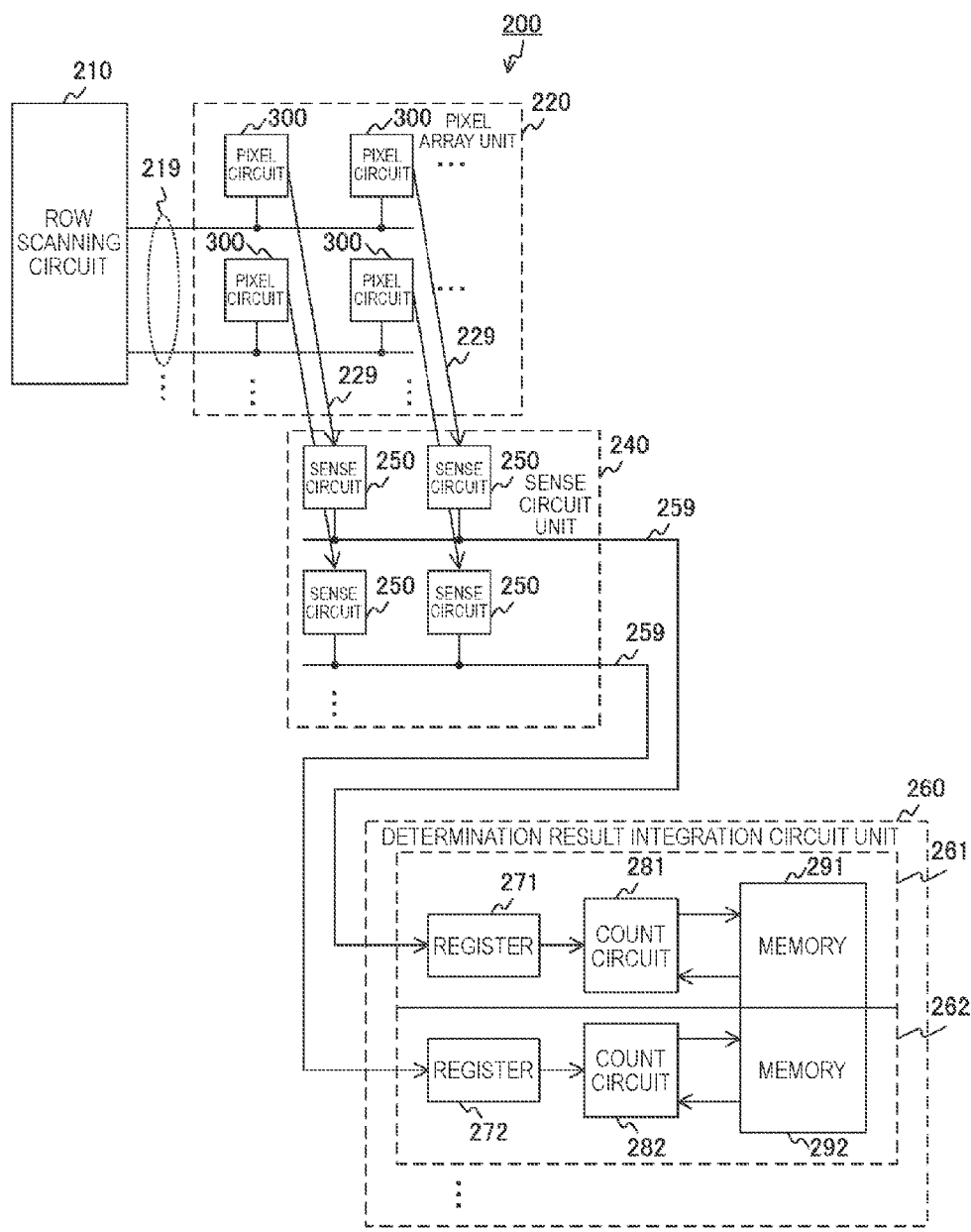
FIG. 2 is a block diagram illustrating one configuration example of an image sensor according to the first embodiment.

FIG. 2 is a block diagram illustrating one configuration example of the image sensor 200 in the first embodiment. The image sensor 200 includes a row scanning circuit 210, a pixel array unit 220, a sense circuit unit 240, and a determination result integration circuit unit 250.

The row scanning circuit 210 sequentially exposes each row to light, in accordance with the control of the driving circuit 130.

In the pixel array unit 220, a plurality of pixel circuits 300 are arranged in a matrix form in a row direction and a column direction. Each pixel circuit has a photoelectric conversion element and has a function for outputting an electric signal according to incidence of photons. The pixel array unit 220 is formed on a first semiconductor substrate, for example.

The sense circuit unit 240 is formed on a second semiconductor substrate different from the first semiconductor substrate. In the sense circuit unit 240, a plurality of sense circuits 250 are arranged in a matrix form in the row direction and the column direction for example, in a one-to-one correspondence with the plurality of pixel circuits 300 arranged in a matrix in the pixel array unit 220. Each sense circuit 250 has a function for receiving a signal from the pixel circuit 300 and making a binary determination of whether or not photon is incident on the pixel circuit 300 in a predetermined period.

Then, the first semiconductor substrate and the second semiconductor substrate are stacked. For example, the plurality of pixel circuits 300 formed on the first semiconductor substrate and the plurality of sense circuits 250 formed on the second semiconductor substrate are stacked so as to face each other on a one-to-one basis. The opposing pixel circuits 300 and sense circuits 250 are connected by respective output signal lines 229. In the sense circuit unit 250, outputs of the sense circuits 250 arranged in the same row are connected to a common transfer line 259.

The determination result integration circuit unit 260 has a function for integrating determination results of the sense circuits 250 a plurality of times for each pixel to generate two-dimensional imaging data with gradation. In the determination result integration circuit unit 260, determination result integration circuits 261, 262, . . . are arranged corresponding to the row arrangement of the sense circuits 250 in the sense circuit unit 240.

The determination result integration circuit 261 includes a register 271 for retaining a determination value transferred through the transfer line 259 of a 0th row, a count circuit 281 for counting the value retained in the register 271, and a memory 291 for storing a count result of the count circuit 281. Also, the determination result integration circuit 262 includes a register 272 for retaining a determination value transferred through the transfer line 259 of a first row, a count circuit 282 for counting the value retained in the register 272, and a memory 292 for storing a count result of the count circuit 282.

Configuration Example of Pixel Circuit

Figure 3:
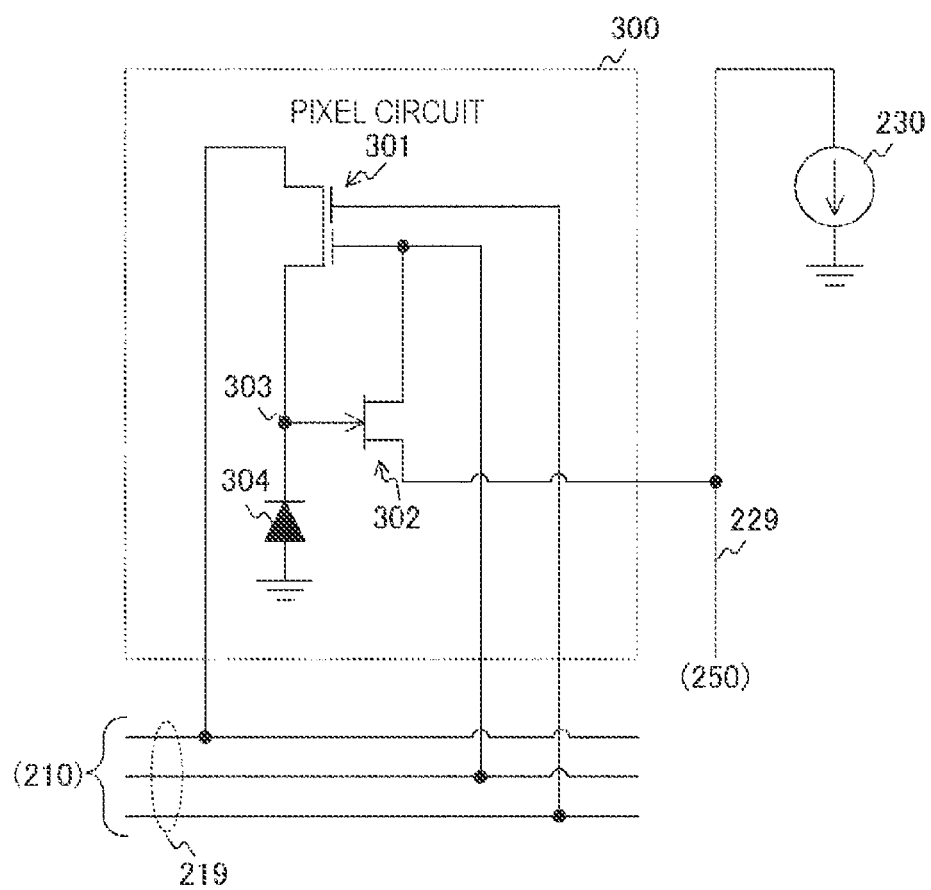
FIG. 3 is a circuit diagram illustrating one configuration example of a pixel circuit in the first embodiment.

FIG. 3 is a circuit diagram illustrating one configuration example of a pixel circuit 300 in the first embodiment. The pixel circuit 300 includes a reset transistor 301, a control transistor 302, an electric charge accumulation portion 303, and a photoelectric conversion portion 304. As the reset transistor 301, an N-type metal-oxide-semiconductor field-effect transistor (MOSFET) is used, for example. As the control transistor 302, an N-type junction field-effect transistor (JFET) is used, for example. Like this, in a CMD in which an FD is not provided in a pixel, it is possible to eliminate the dark current of the FD and to increase the conversion efficiency of converting the electric charge to a voltage to a higher value than the image sensor equipped with the FD. Also, in the CMD, the electric charge generated by light reception is retained unless reset, and even when the electric charge is read out as a signal, the electric charge is retained in an accumulated state without disappearing. Thereby, so-called nondestructive readout is enabled.

A ground potential is applied to an anode of the photoelectric conversion portion 304, and a cathode is connected to the electric charge accumulation portion 303. Also, a gate of the control transistor 302 is connected to the electric charge accumulation portion 303, and a source is connected to the sense circuit 250 and a constant current circuit 230, and a drain functions as a part of gates of the reset transistor 301 and is connected to the row scanning circuit 210. Also, a source of the reset transistor 301 is connected to the electric charge accumulation portion 303, and a drain is connected to the row scanning circuit 210. Also, the reset transistor 301 has two gates, one of which is connected to the control transistor 302 and the other is connected to the row scanning circuit 210. In the following, one of the two gates of the reset transistor 301 connected to the row scanning circuit 210 will be referred to as "reset gate", and the drain will be referred to as "reset drain".

The photoelectric conversion portion 304 converts light to electric charge. The electric charge accumulation portion 303 accumulates the photoelectrically converted electric charge and supplies a signal voltage according to the accumulated electric charge amount to the control transistor 302.

The control transistor 302 controls a source voltage in accordance with the signal voltage from the electric charge accumulation portion 303. The control transistor 302 supplies an electric signal of this source voltage to the sense circuit 250. Note that the signal voltage is one example of an input voltage described in the claims, and the source voltage is one example of an output voltage described in the claims.

The reset transistor 301 sets the electric charge amount of the electric charge accumulation portion 303 to an initial value in accordance with the control of the row scanning circuit 210.

The row scanning circuit 210 sets the reset drain, the reset gate, and the drain of the control transistor 302 to a high level when resetting the electric charge amount, and sets them to a low level when accumulating the electric charge (that is, light exposure). For example, at a timing of light exposure start, the row scanning circuit 210 sets the reset drain, the reset gate, and the drain of the control transistor 302 to the high level over a pulse period. Even when such driving is performed, the control transistor 302 operates in a saturation region at least at the time of resetting, and thus, even if the drain voltage is changed, the channel potential does not change, and the drain current does not change either. Therefore, at the time of resetting, the electric charge accumulation portion 303 is efficiently reset, but unnecessary current does not leak from the channel of the control transistor 302 to the reset drain.

Figure 4:
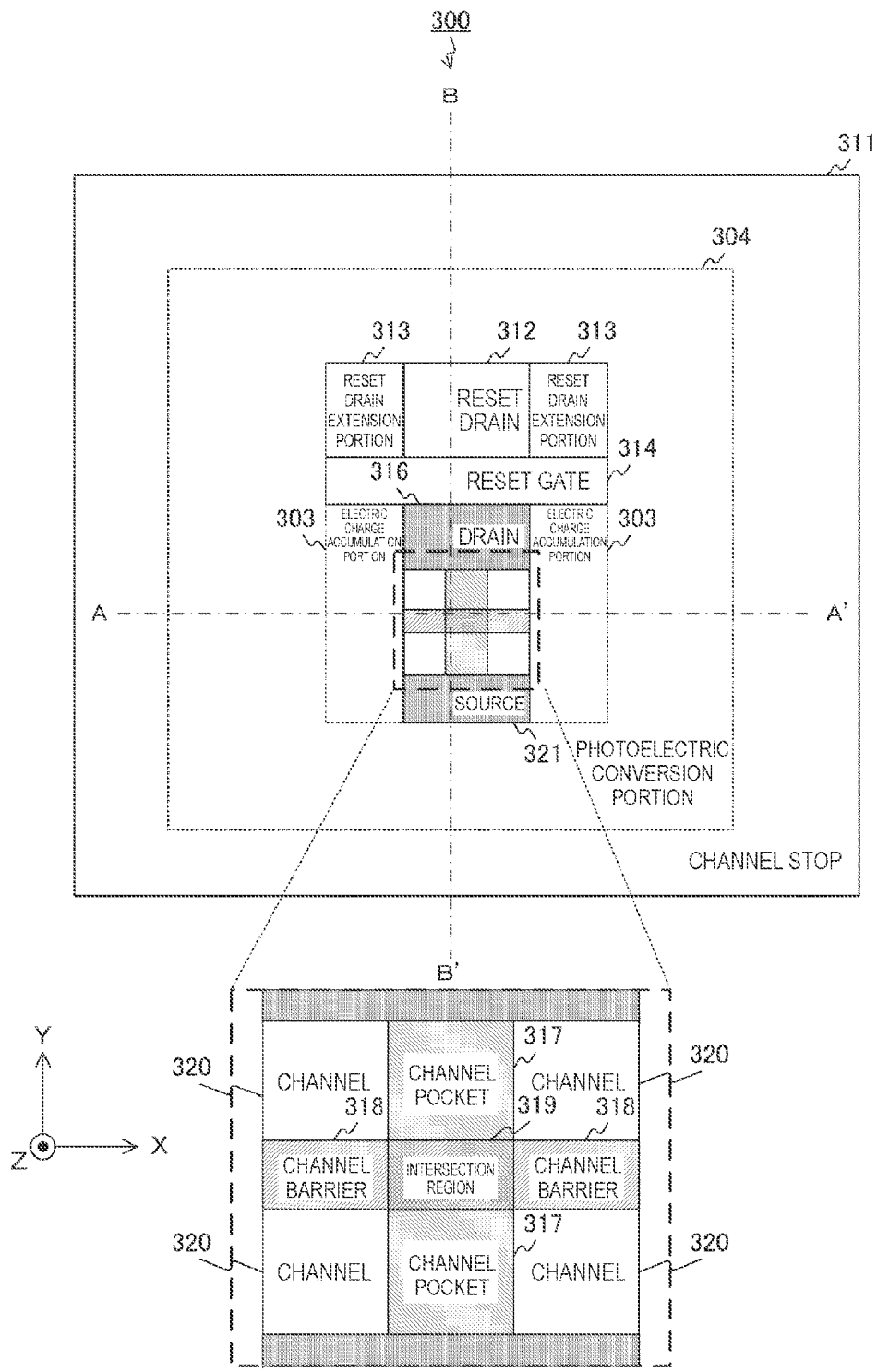
FIG. 4 is an example of a surface view of a pixel circuit in the first embodiment.

FIG. 4 is an example of a surface view of the pixel circuit 300 in the first embodiment. This pixel circuit 300 is formed on one side of both surfaces of the semiconductor substrate and the other side is used as a light receiving surface. With this light receiving surface as a back surface, a surface opposite to the back surface corresponds to a front surface in FIG. 4. Also, in the following, the direction from the front surface to the back surface is a downward direction. On the front surface, a channel stop 311, a reset drain 312, reset drain extension portions 313, a reset gate 314, a drain 316, and a source 321 are formed. Also, channel pockets 317, channel barriers 318, an intersection region 319, and channels 320 are formed between the drain 316 and the source 321.

Also, the channel stop 311 is formed of P-type semiconductor, for example. The reset drain 312, the reset drain extension portions 313, the drain 316, the channels 320, the channel pockets 317, and the source 321 are formed of N-type semiconductor, for example. Also, the channel barriers 318 are formed of P-type semiconductor, for example. Also, the reset gate 314 is formed of N-type polysilicon or the like.

The reset drain 312 and the reset gate 314 correspond to the drain and the gate of the reset transistor 301. Also, the drain 316 and the source 321 correspond to the drain and the source of the control transistor 302.

In the following, an axis parallel to the direction from the source 321 to the drain 316 will be referred to as "Y axis", and an optical axis will be referred to as "Z axis", and an axis orthogonal to the Y axis and Z axis will be referred to as "X axis".

In the Y-axis direction, the reset gate 314 is provided at a position adjacent to the drain 316. Also, in the Y-axis direction, the reset drain 312 is provided on one side of both sides of the reset gate 314 not adjacent to the drain 316. Also, the reset drain extension portions 313 are provided on both sides of the reset drain 312 in the X axis direction.

Also, the channel pockets 317 are provided in the Y axis direction between the drain 316 and the source 321. The potential of the channel pockets 317 is in a higher region than the potential of the channels 320. The center part of the channel pockets 317 is the intersection region 319 across the channel barriers 318 described later.

Also, the channel barriers 318 are provided in the X axis direction between the drain 316 and the source 321. The center part of the channel barriers 318 is the intersection region 319 across the channel pockets 317. The potential of the channel barriers 318 is lower than the potential of the channels 320.

Also, in the intersection region 319, N-type impurities of the channel pockets 317 and P-type impurities of the channel barriers 318 cancel each other, and as a result the intersection region 319 is a region where the potential is higher than the channel barriers 318 and lower than the channel pockets 317. That is, the intersection region 319 functions as a channel barrier in the X axis direction and functions as a channel pocket in the Y axis direction.

With the channel pockets 317, portions having a higher potential than the surrounding is formed at the center parts in the channel width direction of the channels 320 portions, and the current density of the channels 320 portions is higher than the surrounding. Also, the maximum value of the potential of the electric charge accumulation portion 303 is formed at the substantially center part of the channels 320 portions, and thus the part where the current density of the channels 320 portions is the largest is identical with the position of the maximum value of the potential of the electric charge accumulation portion 303 portion on the plane, and the degree of modulation of the potential of the channels 320 portions relative to the potential of the electric charge accumulation portion 303 is improved, and thereby the pixel circuit 300 can increase the conversion efficiency of converting the electric charge to a voltage.

With the channel barriers 318, the saddle point that limits the channel current is made identical with the position of the maximum value of the potential of the electric charge accumulation portion 303, and thereby the degree of modulation of the potential of the channels 320 portions relative to the potential of the electric charge accumulation portion 303 is improved, and thereby the pixel circuit 300 can increase the conversion efficiency of converting the electric charge to a voltage.

The electric charge accumulation portion 303 is formed under the drain 316 and the source 321, and the photoelectric conversion portion 304 is formed under the electric charge accumulation portion 303. The electric charge accumulation portion 303 and the photoelectric conversion portion 304 are unable to be visually recognized from the front surface. Therefore, in FIG. 4, respective boundaries of the electric charge accumulation portion 303 and the photoelectric conversion portion 304 are represented by dotted lines. As illustrated by these dotted lines, in the plane perpendicular to the optical axis, the area of the electric charge accumulation portion 303 is larger than the area of the control transistor 302 including the drain 316 and the source 321.

Figure 5:
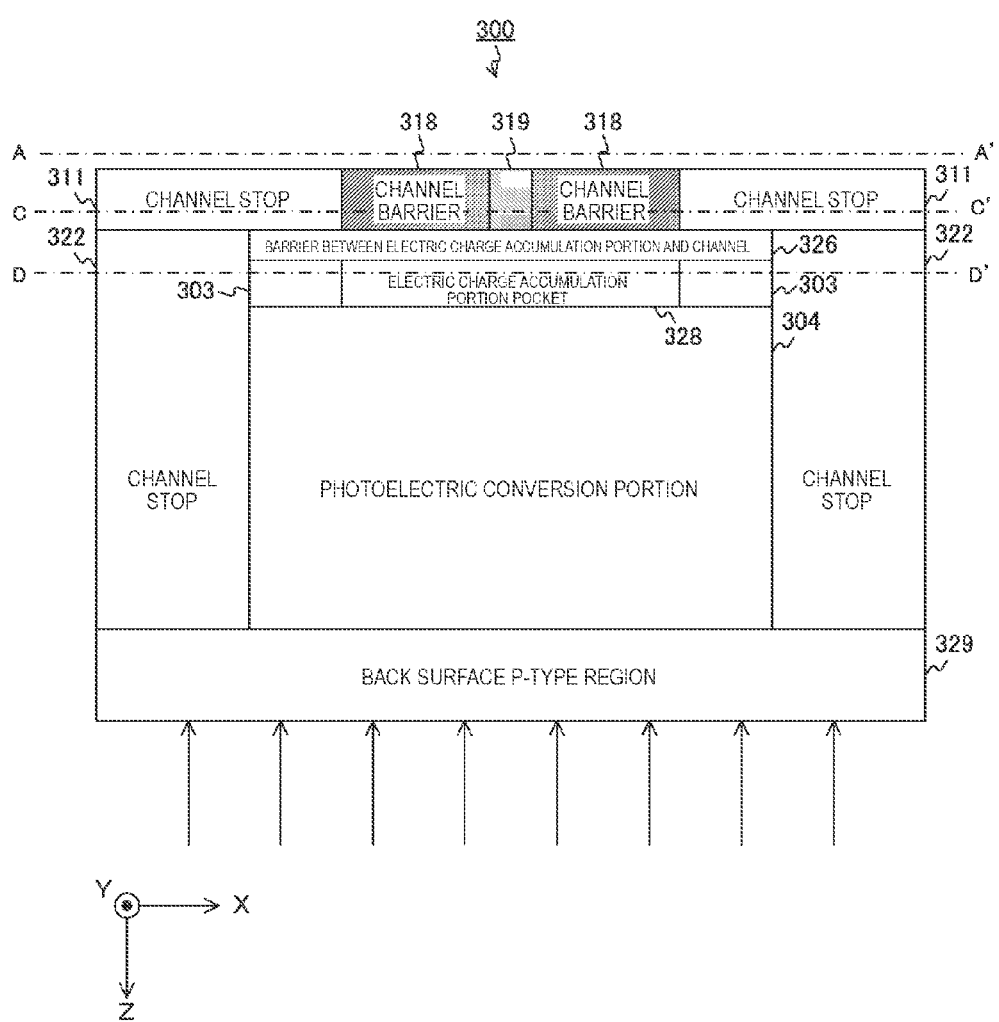
FIG. 5 is an example of a cross-sectional view along X axis of a pixel circuit in the first embodiment.

FIG. 5 is an example of a cross-sectional view of the pixel circuit 300 along the A-A' axis of FIG. 4 parallel to the X axis in the first embodiment. In the pixel circuit 300, a back surface P-type region 329 is located at a lowermost part, and a channel stop 322 and the photoelectric conversion portion 304 are provided thereon. The electric charge accumulation portion 303 and an electric charge accumulation portion pocket 328 are provided on the photoelectric conversion portion 304, and a barrier between electric charge accumulation portion and channel 326 is provided on the electric charge accumulation portion 303 and the electric charge accumulation portion pocket 328. Also, the photoelectric conversion portion 304, the electric charge accumulation portion 303, the electric charge accumulation portion pocket 328, and the barrier between electric charge accumulation portion and channel 326 are provided in a region surrounded by the channel stop 322. The channel barriers 318 and the intersection region 319 are provided on the barrier between electric charge accumulation portion and channel 326. Also, the channel stop 311 is provided on the channel stop 322 and the barrier between electric charge accumulation portion and channel 326, and the channel barriers 318 and the intersection region 319 are provided in the region sandwiched by the channel stop 311.

The back surface P-type region 329, the channel stop 322, and the barrier between electric charge accumulation portion and channel 326 are formed of P-type semiconductor, for example. Also, the photoelectric conversion portion 304, the electric charge accumulation portion 303, and the electric charge accumulation portion pocket 328 are formed of N-type semiconductor, for example.

Also, a lower surface of the back surface P-type region 329 corresponds to the back surface of the pixel circuit 300, and the back surface is irradiated with light.

The image sensor whose back surface is irradiated with light in this way is called a backside illuminated image sensor.

In order to prevent the position of the maximum value of the potential of the electric charge accumulation portion 303 from deviating due to the influence of forming the channel barriers 318 in the channels 320 portions, the electric charge accumulation portion pocket 328 is formed of N-type impurities in a substantially same planar pattern as the channel barriers 318 to cancel the influence of the channel barriers 318 on the potential of the electric charge accumulation portion 303. As a result, the saddle point that limits the channel current is made identical with the position of the maximum value of the potential of the electric charge accumulation portion 303, and thereby the degree of modulation of the potential of the channels 320 portions relative to the potential of the electric charge accumulation portion 303 is improved, and thereby the pixel circuit 300 can increase the conversion efficiency of converting the electric charge to a voltage.

The barrier between electric charge accumulation portion and channel 326 separates the drain 316, the source 321, and the channels 320 from the electric charge accumulation portion 303. The barrier between electric charge accumulation portion and channel 326 is formed by doping impurities (such as indium) having a smaller diffusion coefficient than impurities of the drain 316, the source 321, and the channels 320. Note that the impurities doped in the barrier between electric charge accumulation portion and channel 326 are not limited to indium, as long as the impurities have a smaller diffusion coefficient than the impurities of the channels 320 and the like. An example may be boron. Also, when the control transistor 302 is a P-channel transistor, arsenic or phosphorus can be used as an impurity of the barrier between electric charge accumulation portion and channel 326, for example.

The amount of overlap of each impurity is reduced by forming the barrier between electric charge accumulation portion and channel 326, it is possible to reduce the amount of variation in potential in each region when the total amount of the impurities in the pixel circuit 300 fluctuates. That is, it is possible to improve the robustness against disturbance such as variation of the total amount of the impurities.

Figure 6:
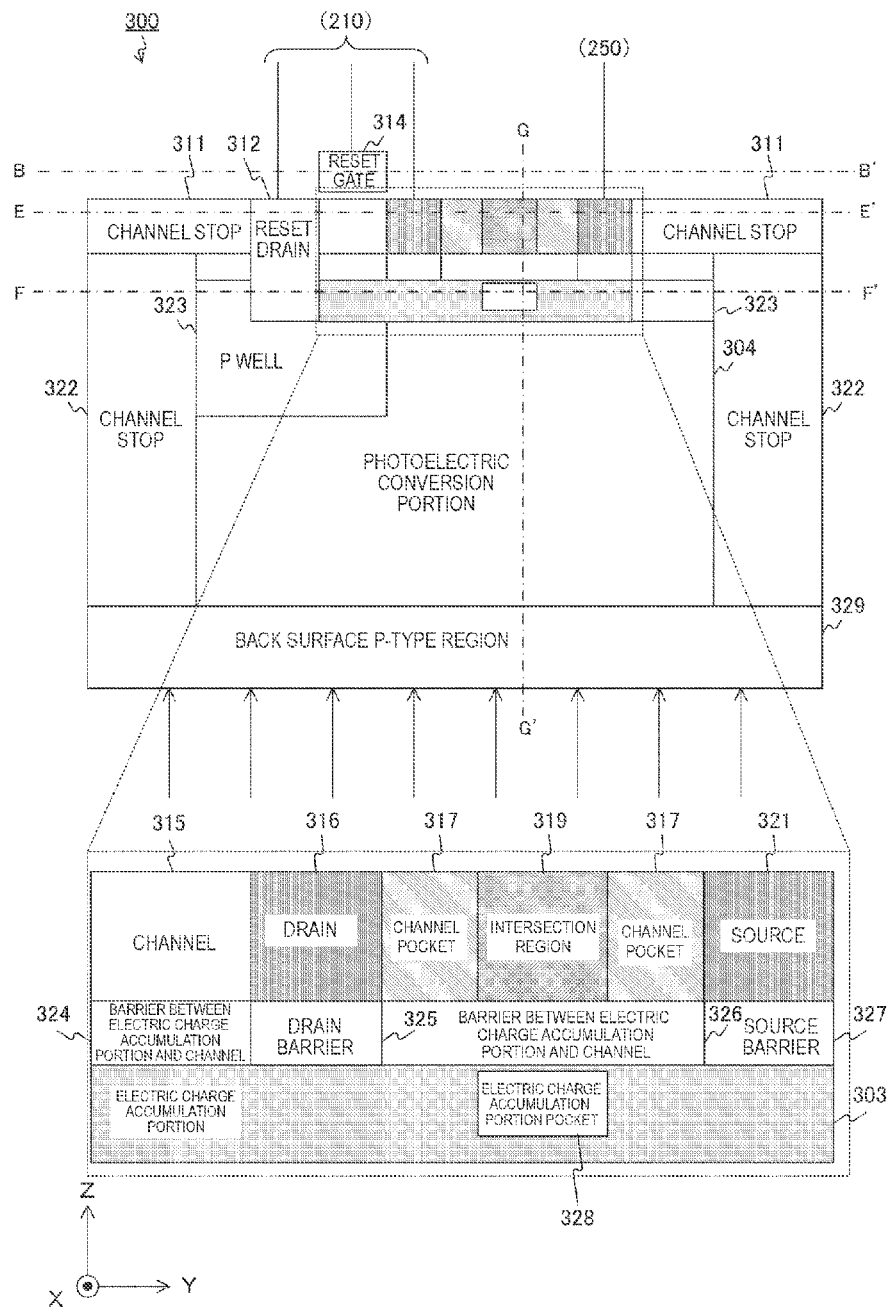
FIG. 6 is an example of a cross-sectional view along Y axis of a pixel circuit in the first embodiment.

FIG. 6 is an example of a cross-sectional view of the pixel circuit 300 along the B-B' axis of FIG. 4 parallel to the Y axis in the first embodiment. The photoelectric conversion portion 304 and the channel stop 322 are provided on the back surface P-type region 329, and the electric charge accumulation portion 303 and a P well 323 are provided on the photoelectric conversion portion 304. The center part of the electric charge accumulation portion 303 is the intersection region 319 that intersects the electric charge accumulation portion pocket 328 provided in the X axis direction. The barrier between electric charge accumulation portion and channel 326 is provided above the electric charge accumulation portion pocket 328, and the channel pockets 317 are provided on the barrier between electric charge accumulation portion and channel 326. The center part of the channel pockets 317 is the intersecting region 319 that intersects the channel barriers 318 provided in the X axis direction.

On the Z axis (optical axis), a drain barrier 325 is provided between the drain 316 and the electric charge accumulation portion 303 to separate the drain 316 from the electric charge accumulation portion 303, and a source barriers 327 is provided between the source 321 and the electric charge accumulation portion 303 to separate the source 321 from the electric charge accumulation portion 303. Also, a channel 315 is provided right below the reset gate 314, and a barrier between electric charge accumulation portion and channel 324 is provided between the channel 315 and the electric charge accumulation portion 303 on the Z axis (optical axis) to separate the channel 315 from the electric charge accumulation portion 303. As described above, the electric charge accumulation portion 303 is provided between the drain 316 and the source 321 of the control transistor 302 and the photoelectric conversion portion 304 on the Z axis (optical axis). According to this configuration, the area of the control transistor 302 on a plane orthogonal to the optical axis can be reduced as compared with the past configuration in which the electric charge accumulation portion is provided inside the control transistor (between the source and the drain). Therefore, it is possible to miniaturize pixels while maintaining detection accuracy.

Also, the reset drain 312 is formed to have the same depth as the electric charge accumulation portion 303. Thereby, the reset drain 312 is adjacent to the electric charge accumulation portion 303, and the electric charge accumulation portion 303 can be reset by applying a voltage in a direction perpendicular to the Z axis (optical axis). This reset by voltage application in the direction perpendicular to the optical axis is called a lateral reset.

The P well 323 is formed of low concentration P-type semiconductor, for example. Also, the channel 315 is formed of N-type semiconductor, for example. The barrier between electric charge accumulation portion and channel 324, the drain barrier 325, and the source barrier 327 are formed of P-type semiconductor, for example. Also, the reset gate 314 and the channels 320 of the control transistor 302 are formed according to the same impurity profile.

The channel 315 corresponds to the channel of the reset transistor 301. In addition to the drain of the control transistor 302, the drain 316 is also used as one of the two gates of the reset transistor 301. In this way, the drain 316 also serves as the gate of the reset transistor 301, and thereby can be completely reset even with a low voltage.

Figure 7:
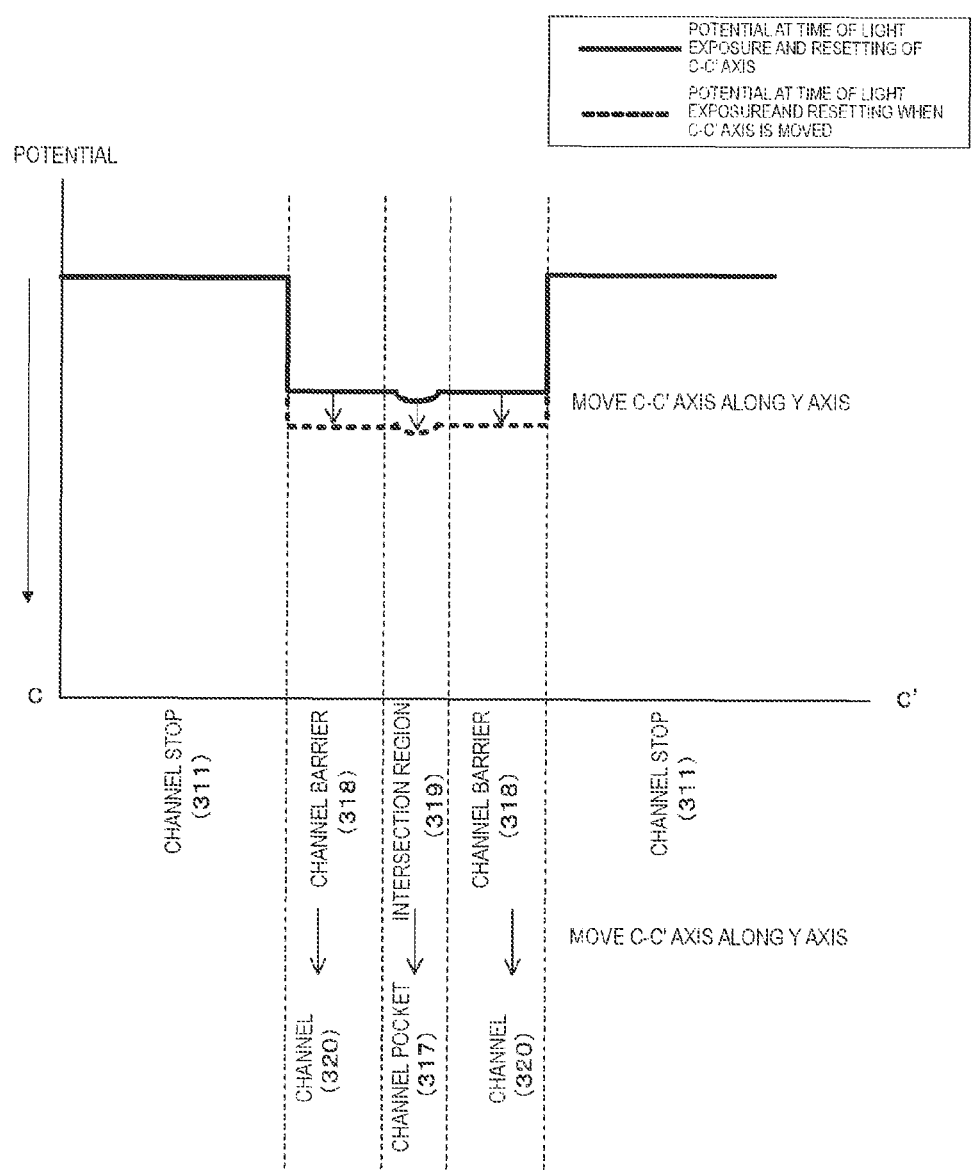
FIG. 7 is a potential diagram of C-C' axis in the first embodiment.

FIG. 7 is a potential diagram of the C-C' axis in the first embodiment. The horizontal axis of FIG. 7 is the C-C' axis of FIG. 5, and the vertical axis is potential. In FIG. 7, the thick line indicates the potential at the time of light exposure and resetting of the C-C' axis. As indicated by this thick line, the potential of the intersection region 319 is slightly higher than the potential of the channel barriers 318. On the other hand, the thick dotted line indicates the potential at the time of light exposure and resetting when the C-C' axis is moved along the Y axis (the direction from the drain 316 to the source 321) between the drain 316 and the source 321. Here, it is assumed that, by the movement, the C-C' axis passes through the region of the channel barriers 318 and the intersection region 319 and reaches the region where the channel barriers 318 do not exist. That is, the channels 320 and the channel pockets 317 are reached. As described above, the channels 320 and the channel pockets 317 have a higher potential than the channel barriers 318 and the intersection region 319. Therefore, as exemplified in FIG. 7, the thick dotted line shape is a shape in which the thick solid line is shifted slightly in the downward direction (that is, the direction in which the electric potential becomes higher).

Figure 8:
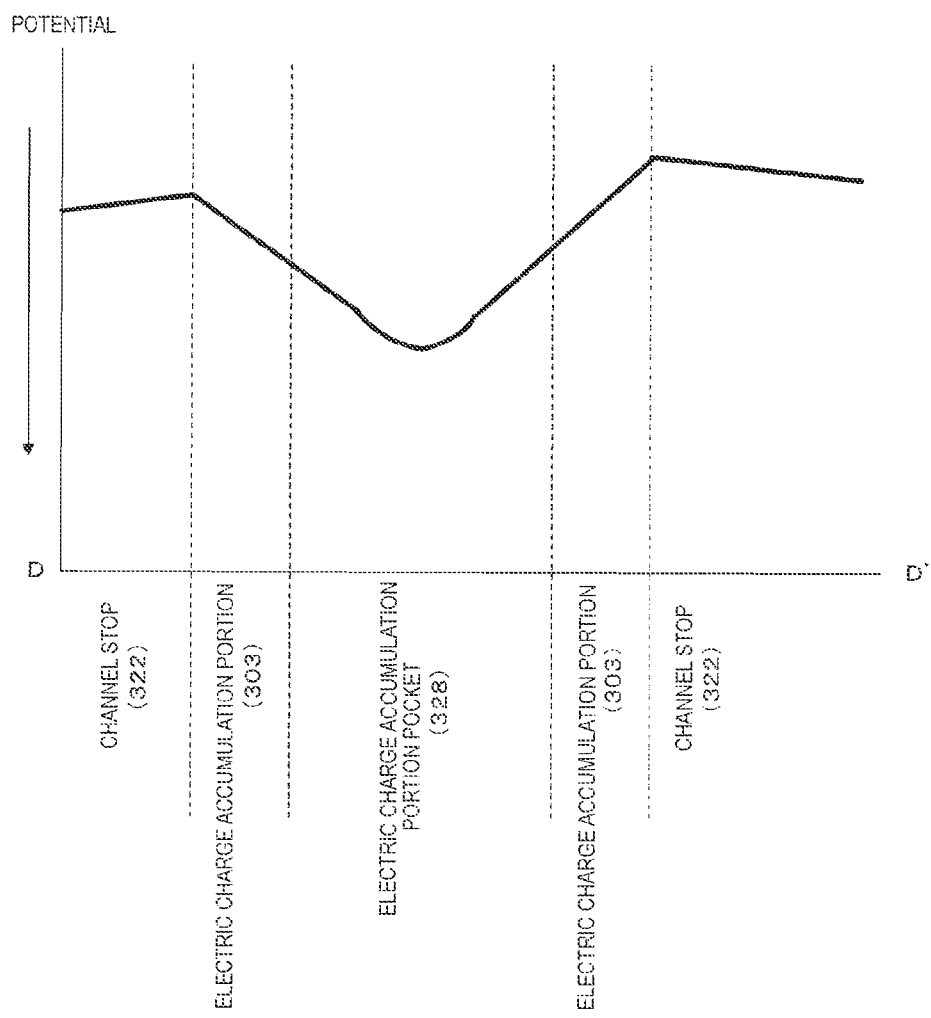
FIG. 8 is a potential diagram of D-D' axis in the first embodiment.

FIG. 8 is a potential diagram of the D-D' axis in the first embodiment. The horizontal axis of FIG. 8 is the D-D' axis of FIG. 5, and the vertical axis is potential. In FIG. 8, the thick line indicates the potential at the time of light exposure and resetting on the D-D' axis. As indicated by this thick line, it is understood that, due to the effect of the electric charge accumulation portion pocket 328, the portion with the highest potential in the electric charge accumulation portion 303 is formed in the center part of the electric charge accumulation portion 303, that is, in the portion corresponding to the intersection region 319.

Figure 9:
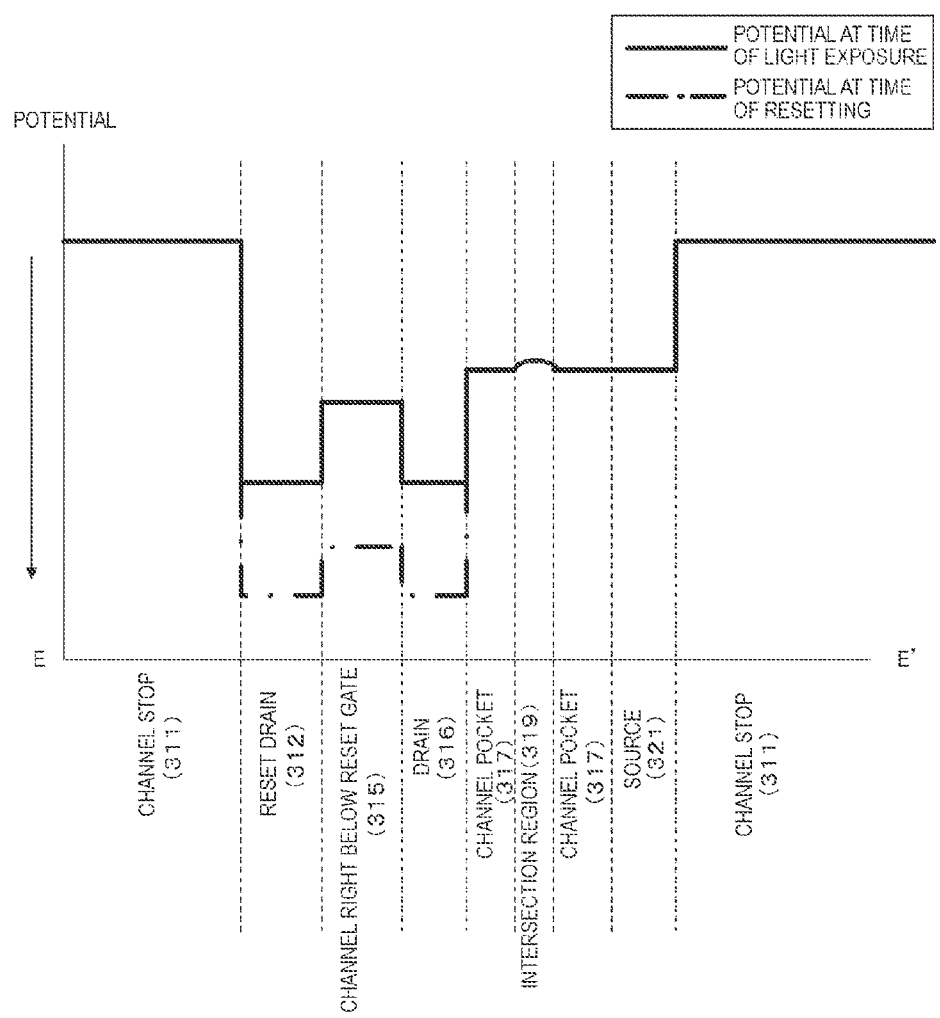
FIG. 9 is a potential diagram of E-E' axis in the first embodiment.

FIG. 9 is a potential diagram of the E-E' axis in the first embodiment. The horizontal axis of FIG. 9 is the E-E' axis of FIG. 6, and the vertical axis is potential. In FIG. 9, the thick line indicates the potential at the time of light exposure of the E-E' axis, and the alternate long and short dashed line indicates the potential at the time of resetting of the E-E' axis. As illustrated in FIG. 9, at the time of resetting, a high level potential is applied to the reset drain 312, the reset gate 314, and the drain 316. Thereby, the reset transistor 301 is turned on, and the electric charge accumulation portion 303 is initialized. On the other hand, at the time of light exposure, a low level potential is applied to the reset drain 312, the reset gate 314, and the drain 316. Thereby, the reset transistor 301 is turned off, and electric charge is accumulated in the electric charge accumulation portion 303. Also, the potential of the intersection region 319 is lower than the channel pockets 317.

Here, a MOSFET described later has a structure in which the capacitance between the gate and the channel and the capacitance between the channel and the electric charge accumulation portion are connected in series. Therefore, in the pixel circuit provided with the MOSFET, the degree of modulation M1 of the channel potential in relation to the potential of the electric charge accumulation portion and the conversion efficiency R1 converting the electron to the voltage are obtained by the following expressions, for example.

$$M1 = C3/(C1+C2+C3) \quad \text{expression 1}$$

$$R1 = C3q/\{(C1+C2) \cdot C3 + (C1+C2+C3) \cdot C4\} \quad \text{expression 2}$$

In expression 1, C1 is the capacitance between the gate and the channel, and C2 is the capacitance between the channel stop and the channel. Also, C3 is the capacitance between the channel and the electric charge accumulation portion. Also, in expression 2, C4 is the capacitance between the electric charge accumulation portion and the photoelectric conversion portion, and q is an electric charge amount. Also, the unit of the conversion efficiency R1 is mV/e−, for example.

In contrast, the control transistor 302 which is a JFET has no gate-channel capacitance (C1). Therefore, the degree of modulation M2 and the conversion efficiency R2 in the pixel circuit 300 are obtained by the following expressions, for example.

$$M2 = C3/(C2+C3) \quad \text{expression 3}$$

$$R2 = C3 \cdot q/\{C2 \cdot C3 + (C2+C3) \cdot C4\} \quad \text{expression 4}$$

It can be understood that, in the expression 1, the degree of modulation M1 of the MOS type is as low as about 0.3, whereas in the expression 3, the degree of modulation M2 of the junction-type is about 0.9, and in the junction-type, the degree of modulation can be made about 3 times. Also from the expression 2 and the expression 4, it can be understood that the conversion efficiency can also be made about 3 times in the junction-type. For example, the electric charge accumulation portion 303 is formed at a depth of about 0.5 micrometer (μm) from the silicon surface, and the size of the control transistor 302 is set to 0.5 micrometer (μm)×0.5 micrometer (μm), and thereby the conversion efficiency can be 3 mV/e−. Thereby, the control transistor 302 can detect one electron.

Figure 10:
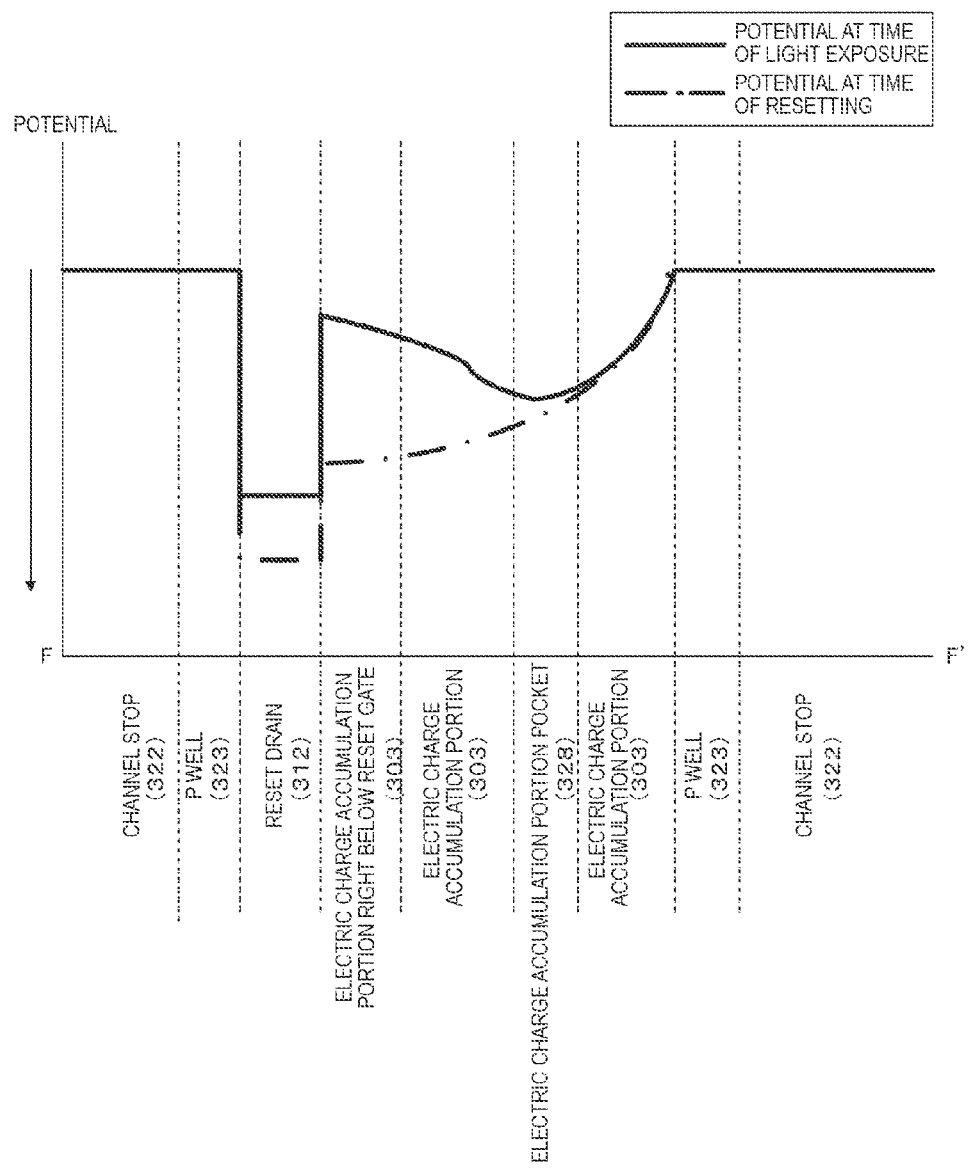
FIG. 10 is a potential diagram of F-F' axis in the first embodiment.

FIG. 10 is a potential diagram of the F-F' axis in the first embodiment. The horizontal axis of FIG. 10 is the F-F' axis of FIG. 6, and the vertical axis is potential. In FIG. 10, the thick line indicates the potential at the time of light exposure of the F-F' axis, and the alternate long and short dashed line indicates the potential at the time of resetting of the F-F' axis. As illustrated in FIG. 10, at the time of resetting, a high level potential is applied to the reset drain 312, the reset gate 314, and the drain 316. On the other hand, at the time of light exposure, a low level potential is applied to the reset drain 312, the reset gate 314, and the drain 316.

Figure 11:
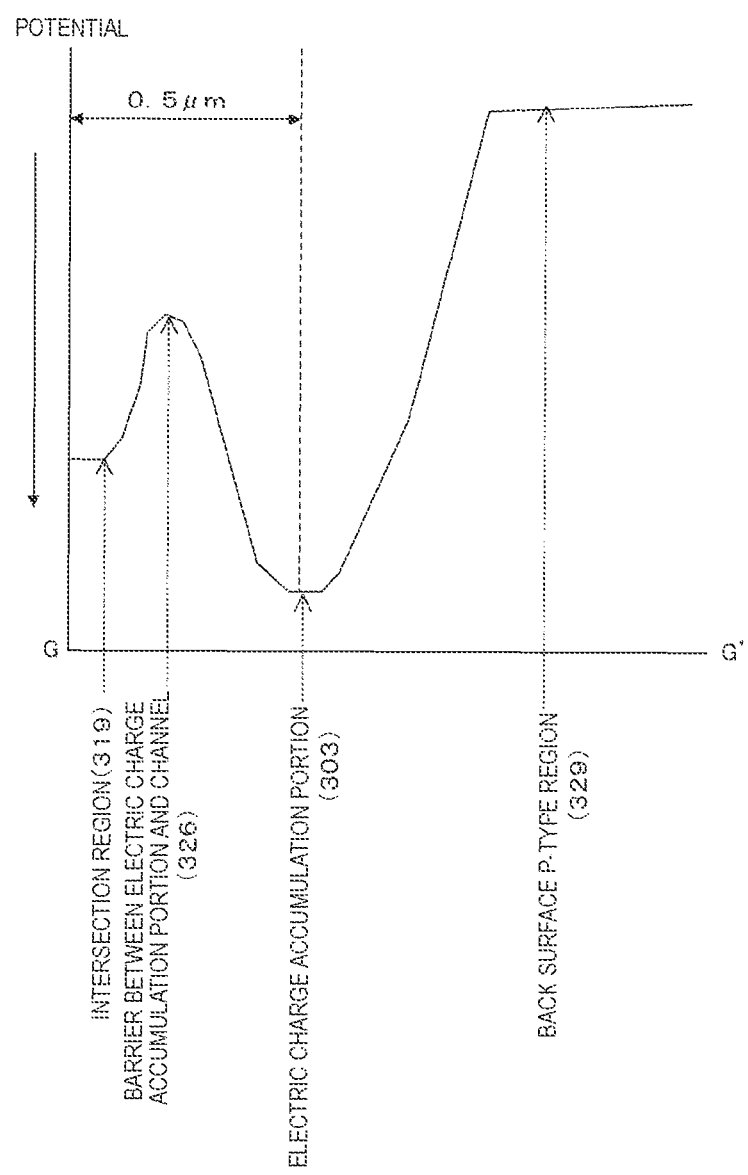
FIG. 11 is a potential diagram of G-G' axis in the first embodiment.

FIG. 11 is a potential diagram of the G-G' axis in the first embodiment. The horizontal axis of FIG. 11 is the G-G' axis of FIG. 6, and the vertical axis is potential. As illustrated in FIG. 11, the barrier between electric charge accumulation portion and channel 326 has a lower potential than the intersection region 319 and the electric charge accumulation portion 303 in the channels 320, and separates the channels 320 from the electric charge accumulation portion 303. Also, the depth of the channels 320 from the Si surface is, for example, 0.1 micrometer (μm), and the depth from the Si surface of the barrier between electric charge accumulation portion and channel 326 is, for example, 0.3 micrometers (μm). Also, the depth of the electric charge accumulation portion 303 from the Si surface is, for example, 0.5 micrometer (μm). Each impurity is formed deeper in the silicon than in the past structure, and thereby the overlap of each impurity is reduced, and the robustness is improved, and the capacitance is reduced, so that the conversion efficiency can be improved. Although the saturation signal electric charge amount decreases, it does not become a problem in the case of a full digital image sensor, since in principle it is only necessary to accumulate one electron.

As described above, the channels 320 and the electric charge accumulation portion 303 are formed of N-type semiconductor, and the barrier between electric charge accumulation portion and channel 326 is formed of P-type semiconductor. Here, in general, in the region where the P-type semiconductor and the N-type semiconductor intersect each other, the variation amount of the potential due to production variation of the dose amount of impurities becomes large. For example, it is assumed that, if the manufacturing variation of impurities is 1% of the total amount of impurities, the potential increases by 1 volt (V) when the P-type impurities increase by 1 unit, and the potential decreases by 1 Volt (V) when the N-type impurities increase by 1 unit. Also, it is assumed that, if each of impurities of P-type and N-type increases by 1 unit, the effective amount will increase by 0.5 unit and the ineffective amount increases by 0.5 unit. In this case, the variation amount of the potential reaches 20 V.

In the configuration in which impurities having a small diffusion coefficient such as indium are not doped, as described above, the potential variation at the boundary between the channels 320 and the electric charge accumulation portion 303 and the barrier between electric charge accumulation portion and channel 326 becomes large. As a result, in the impurity profile, the overlapping portion between the profile of the channels 320 and the like and the profile of the barrier between electric charge accumulation portion and channel 326 may increase. However, since the impurities having a small diffusion coefficient (such as indium) are doped in the barrier between electric charge accumulation portion and channel 326, the overlapping portion becomes smaller, and the variation amount of the potential in relation to the variation in the dose amount of the impurities is reduced. That is, a structure in which the potential variation is small even if there is a disturbance such as the variation in the dose amount of the impurities, in other words, a robust structure to the disturbance is built.

As described above, according to the first embodiment of the present technology, the electric charge accumulation portion 303 is located between the control transistor 302 and the photoelectric conversion portion 304 on the optical axis, the area of the control transistor 302 can be made smaller than the electric charge accumulation portion 303. Thereby, it is possible to eliminate the dark current of the FD and to improve the conversion efficiency of converting the electric charge to a voltage.

Variant Example

In the first embodiment, the N-type reset transistor and the control transistor are provided, but it is also possible to provide a P-type reset transistor and a control transistor. The pixel circuit 300 of the variant example of the first embodiment is different from the first embodiment in that a P-type reset transistor and a control transistor are provided.

Figure 12:
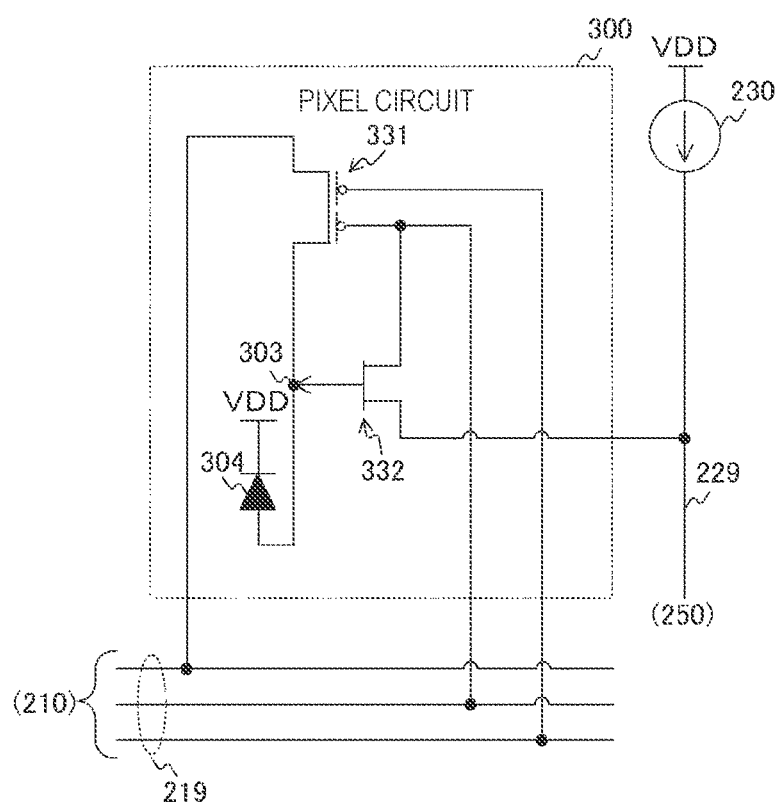
FIG. 12 is a circuit diagram illustrating one configuration example of a pixel circuit in a variant example of the first embodiment.

FIG. 12 is a circuit diagram illustrating one configuration example of the pixel circuit 300 in the variant example of the first embodiment. The pixel circuit 300 of the variant example is different from the first embodiment in that a reset transistor 331 and a control transistor 332 are provided instead of the reset transistor 301 and the control transistor 302.

The reset transistor 331 is a P-type MOSFET, and the control transistor 332 is a P-type JFET. In this case, a power supply is connected to the cathode of the photoelectric conversion portion 304, and the electric charge accumulation portion 303 is connected to the anode. Also, a low level potential is applied to the reset drain 312, the reset gate 314, and the drain 316 at the time of resetting, and a high level potential is applied to the reset drain 312, the reset gate 314, and the drain 316 at the time of light exposure.

As described above, according to the variant example of the first embodiment, the P-type reset transistor 301 and the control transistor 302 are provided, and thus it is possible to perform resetting with the low level potential.

2. Second Embodiment

Although in the first embodiment the reset transistor 301 applies a voltage in the Y axis direction (the direction from the source 321 to the drain 316), the voltage can be applied in the X axis direction orthogonal to the Y axis (that is, in the direction of the channel width). The pixel circuit 300 of the second embodiment is different from the first embodiment in that the reset transistor applies a voltage in the X axis direction.

Figure 13:
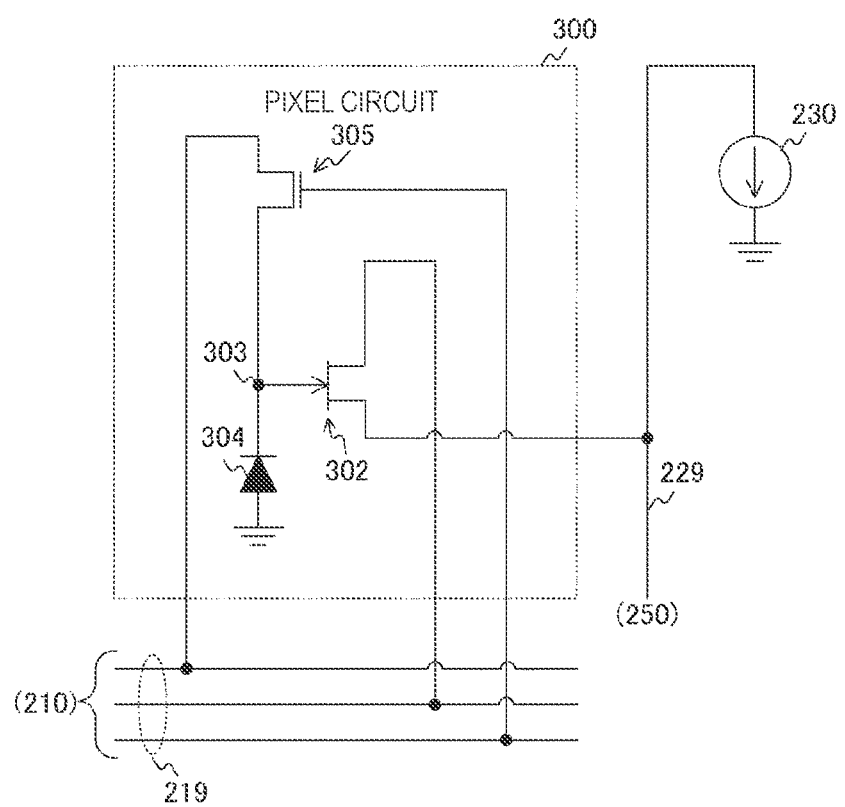
FIG. 13 is a circuit diagram illustrating one configuration example of a pixel circuit in a second embodiment.

FIG. 13 is a circuit diagram illustrating one configuration example of the pixel circuit 300 in the second embodiment. The pixel circuit 300 of the second embodiment is different from the first embodiment in that a reset transistor 305 is provided instead of the reset transistor 301. As the reset transistor 305, an N-type MOSFET is used, for example. The reset transistor 305 does not have two gates and has one gate connected to the row scanning circuit 210. Also, the drain of the control transistor 302 is connected only to the row scanning circuit 210. Although the N-type transistor is provided as the reset transistor 305, a P-type transistor may be provided as the reset transistor 305.

Figure 14:
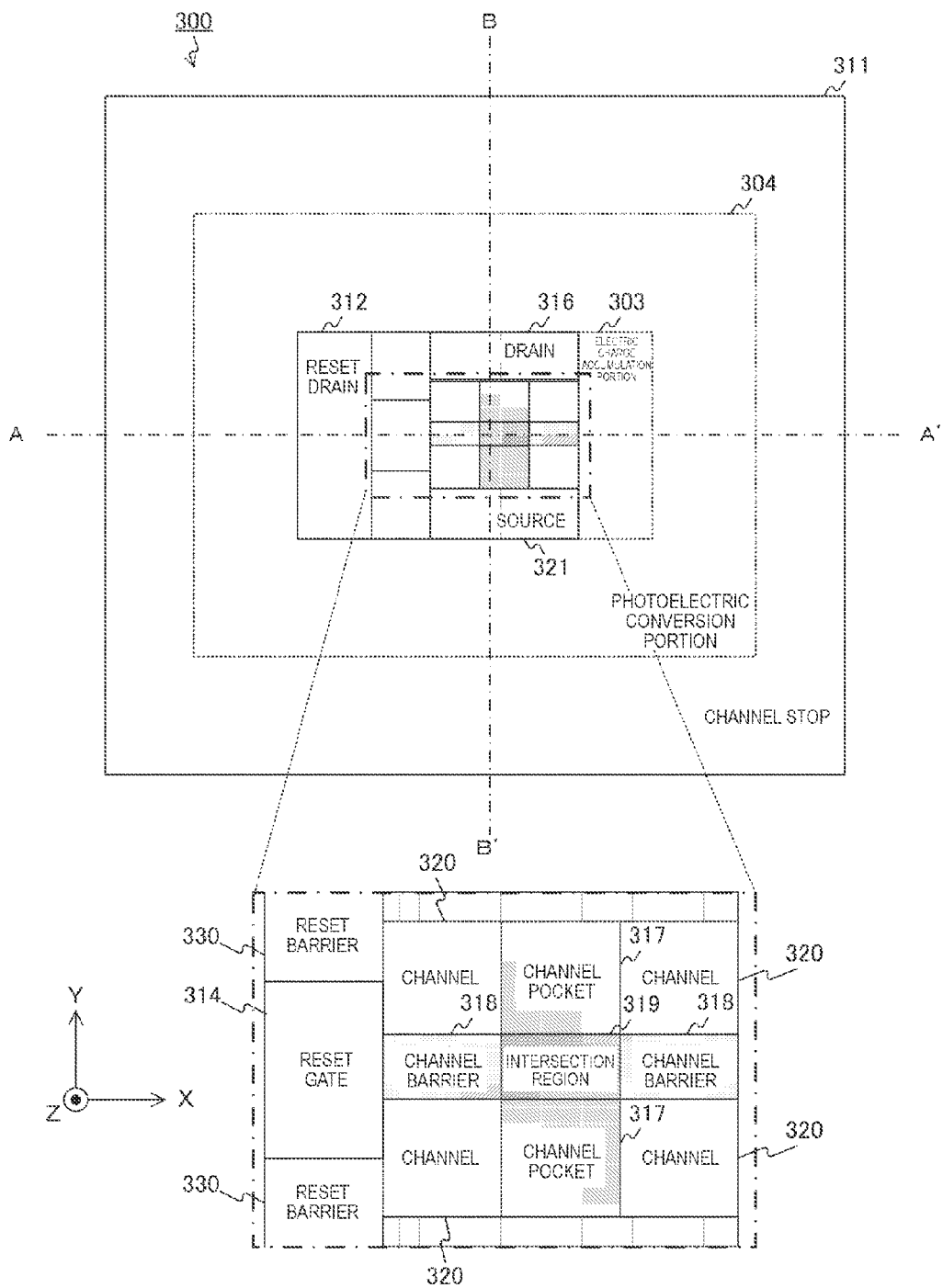
FIG. 14 is an example of a surface view of a pixel circuit in the second embodiment.

FIG. 14 is an example of a surface view of the pixel circuit 300 in the second embodiment. The reset gate 314 of the second embodiment is provided at a position adjacent to the channels 320 and the channel barriers 318 on the X axis. Also, in the second embodiment, reset barriers 330 are further provided on both sides of the reset gate 314 on the Y axis. Also, a reset drain 312 of the second embodiment is provided at one of both sides of the reset gate 314 not adjacent to the channels 320 on the X axis. As described above, the reset drain 312 and the reset gate 314 are arranged along the X axis, and thereby the reset direction (that is, the direction of applying the voltage) can be set in the X axis direction.

Figure 15:
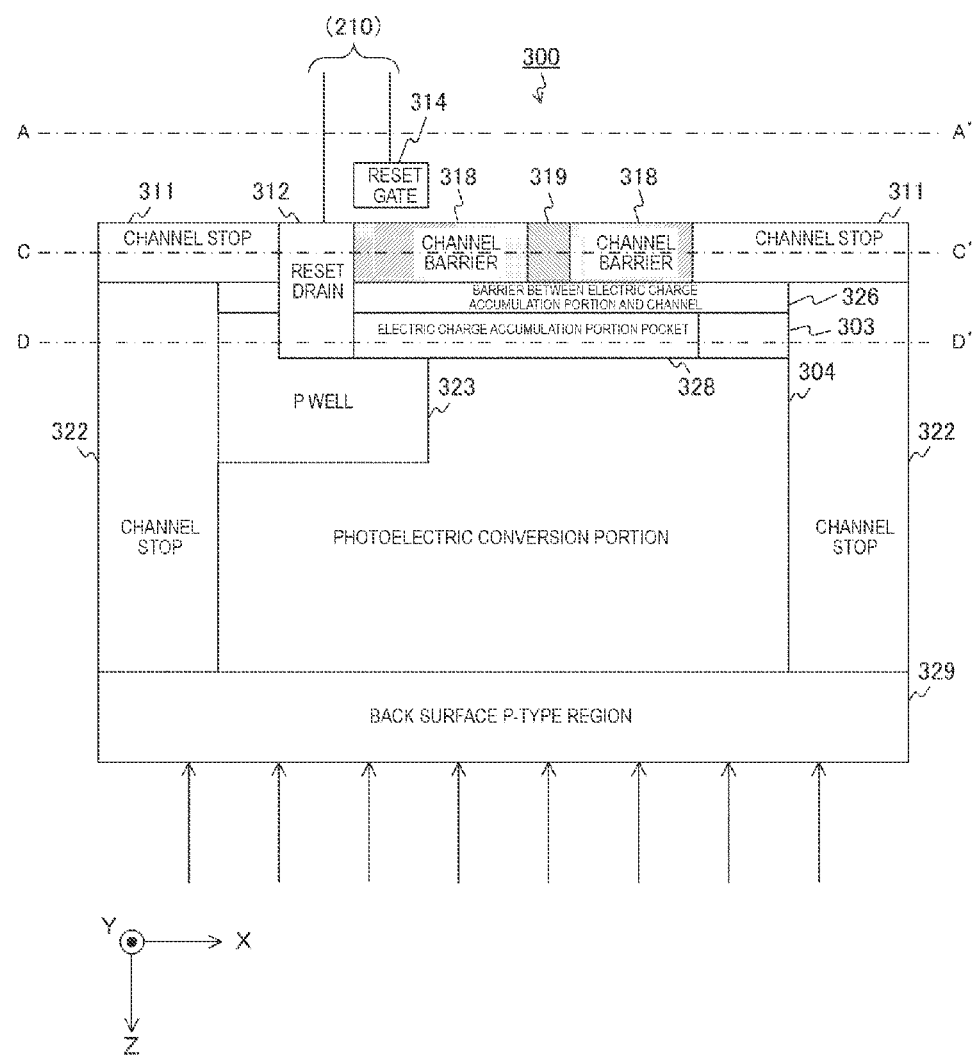
FIG. 15 is an example of a cross-sectional view along the X axis of the pixel circuit in the second embodiment.

FIG. 15 is an example of a cross-sectional view of the pixel circuit 300 along the A-A' axis of FIG. 14 parallel to the X axis in the second embodiment. A back surface P-type region 329 is arranged at the lowermost part, and a photoelectric conversion portion 304 and a channel stop 322 are provided thereon. Also, an electric charge accumulation portion pocket 328, an electric charge accumulation portion 303, and a P well 323 are provided on the photoelectric conversion portion 304. The electric charge accumulation portion pocket 328 is provided in a region surrounded by the electric charge accumulation portion 303. A barrier between electric charge accumulation portion and channel 326 is provided on the electric charge accumulation portion 303 and the electric charge accumulation portion pocket 328, and the channel barriers 318 and an intersection region 319 are provided on the barrier between electric charge accumulation portion and channel 326. A reset gate 314 is provided above the channel barrier 318. Also, the reset drain 312 is formed to have the same depth as the electric charge accumulation portion 303.

Figure 16:
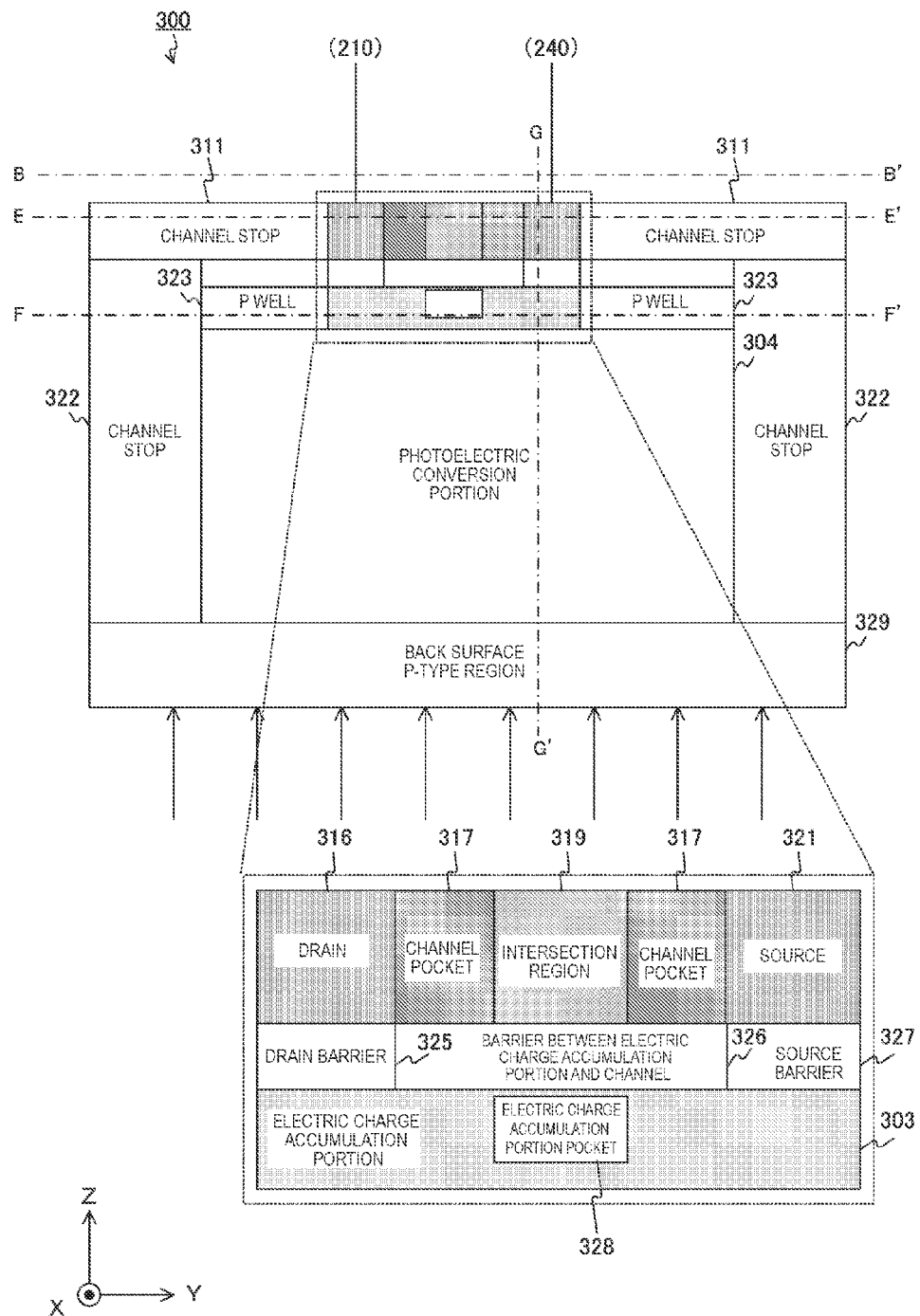
FIG. 16 is an example of a cross-sectional view along the Y axis of the pixel circuit in the second embodiment.

FIG. 16 is an example of a cross-sectional view of the pixel circuit 300 along the B-B' axis of FIG. 14 parallel to the Y axis in the second embodiment. As illustrated in FIG. 16, a channel stop 322 and a photoelectric conversion portion 304 are provided on the back surface P-type region 329. Also, the electric charge accumulation portion 303 and the P well 323 are provided on the photoelectric conversion portion 304, and the barrier between electric charge accumulation portion and channel 326 is provided on the electric charge accumulation portion 303. The center part of the electric charge accumulation portion 303 is an intersection region 319 which intersects the electric charge accumulation portion pocket 328 provided in the X axis direction. Channel pockets 317 and the intersection region 319 are provided on the barrier between electric charge accumulation portion and channel 326. Also, a channel stop 311 is provided on the channel stop 322 and the P well 323. Also, on the Z axis (optical axis), a drain barrier 325 is provided between the drain 316 and the electric charge accumulation portion 303, and a source barrier 327 is provided between the source 321 and the electric charge accumulation portion 303.

Figure 17:
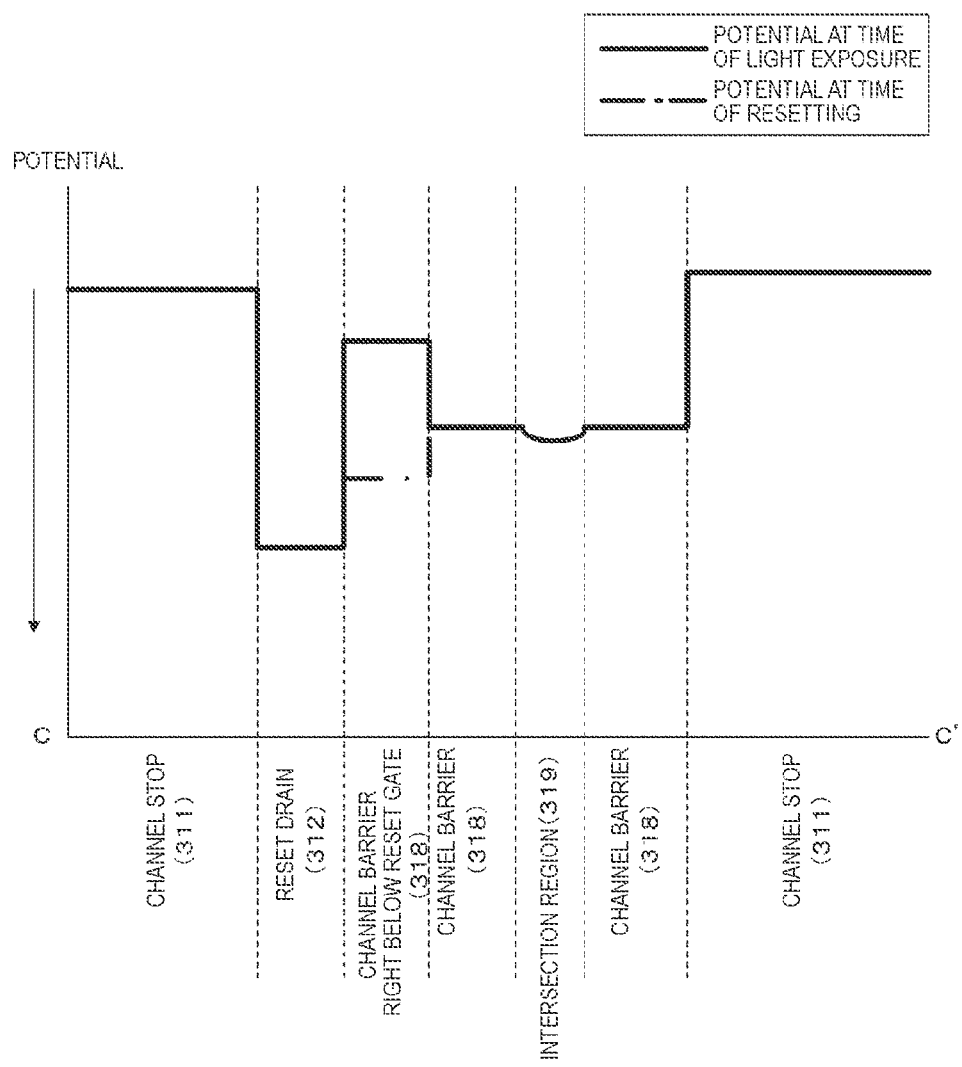
FIG. 17 is a potential diagram of the C-C' axis in the second embodiment.

FIG. 17 is a potential diagram of the C-C' axis in the second embodiment. The horizontal axis in FIG. 17 is the C-C' axis of FIG. 15, and the vertical axis is potential. In FIG. 17, the thick line indicates the potential at the time of light exposure of the C-C' axis, and the alternate long and short dashed line indicates the potential at the time of resetting the C-C' axis. As illustrated in FIG. 17, a high level potential is applied to the reset gate 314 at the time of resetting, and a low level potential is applied to the reset gate 314 at the time of light exposure. Unlike the first embodiment, the potential of the reset drain 312 is not controlled but is a fixed value. Unlike the first embodiment in which the reset drain 312 also serves as a gate, in the second embodiment, only the potential of the reset gate 314 is controlled, and thus the amplitude of the reset pulse becomes large. However, the row scanning circuit 210 only has to drive the reset gate 314, and thus there is an advantage that the driving is simpler than in the first embodiment. In addition, the reset direction is the same as the direction of the electric charge accumulation portion pocket 328, and thus there is also an advantage that it is less likely that unresetting will occur as compared with the first embodiment. Here, the unresetting is a phenomenon in which electric charge exceeding the allowable amount remains in the electric charge accumulation portion 303 immediately after resetting. In the second embodiment, the reset drain 312 and the channels 320 of the control transistor 302 are brought into a conduction state, but are structurally the same as a transistor of multi-drain. Therefore, if the control transistor 302 is driven by a constant current circuit 230, the total current does not increase as compared with the first embodiment.

Figure 18:
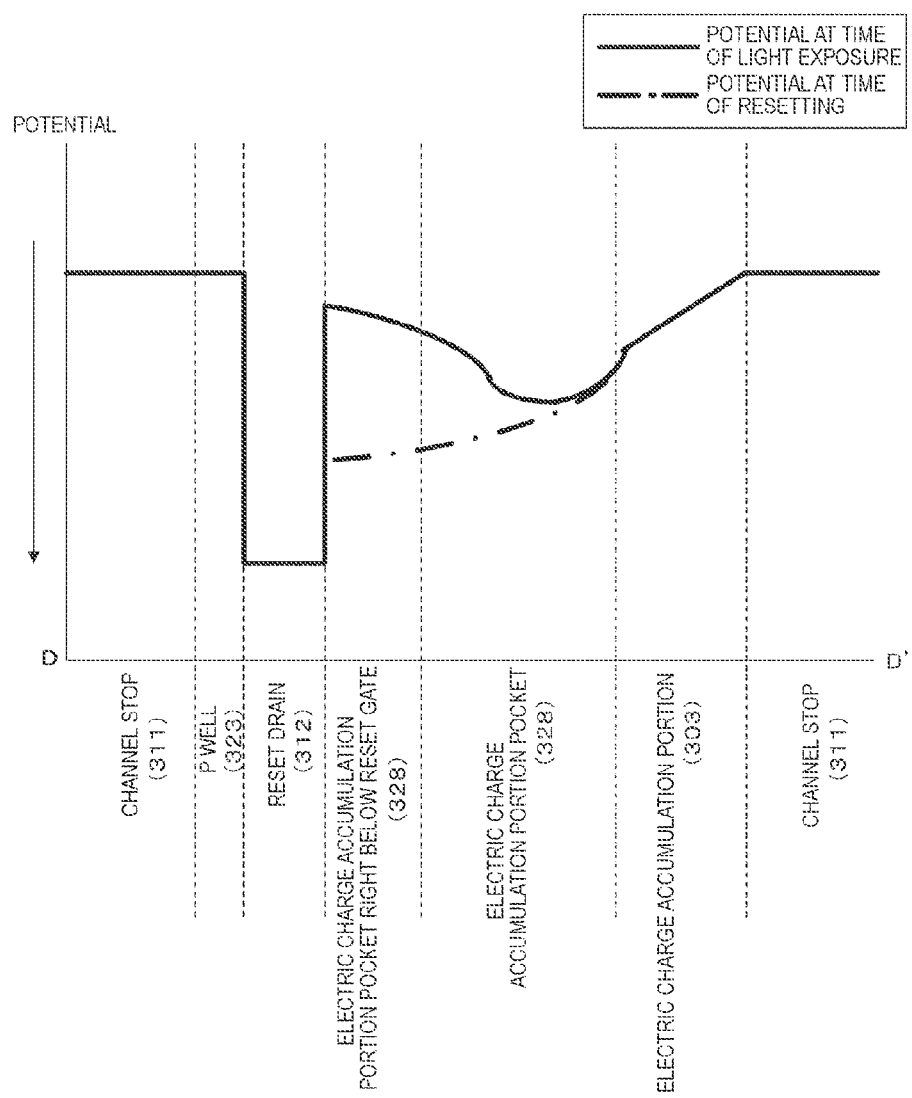
FIG. 18 is a potential diagram of the D-D' axis in the second embodiment.

FIG. 18 is a potential diagram of the D-D' axis in the second embodiment. The horizontal axis of FIG. 18 is the D-D' axis of FIG. 15, and the vertical axis is potential. In FIG. 18, the thick line indicates the potential at the time of light exposure of the D-D' axis, and the alternate long and short dashed line indicates the potential at the time of resetting of the D-D' axis. As illustrated in FIG. 18, a high level potential is applied to the reset gate 314 at the time of resetting, and a low level potential is applied to the reset gate 314 at the time of light exposure.

Figure 19:
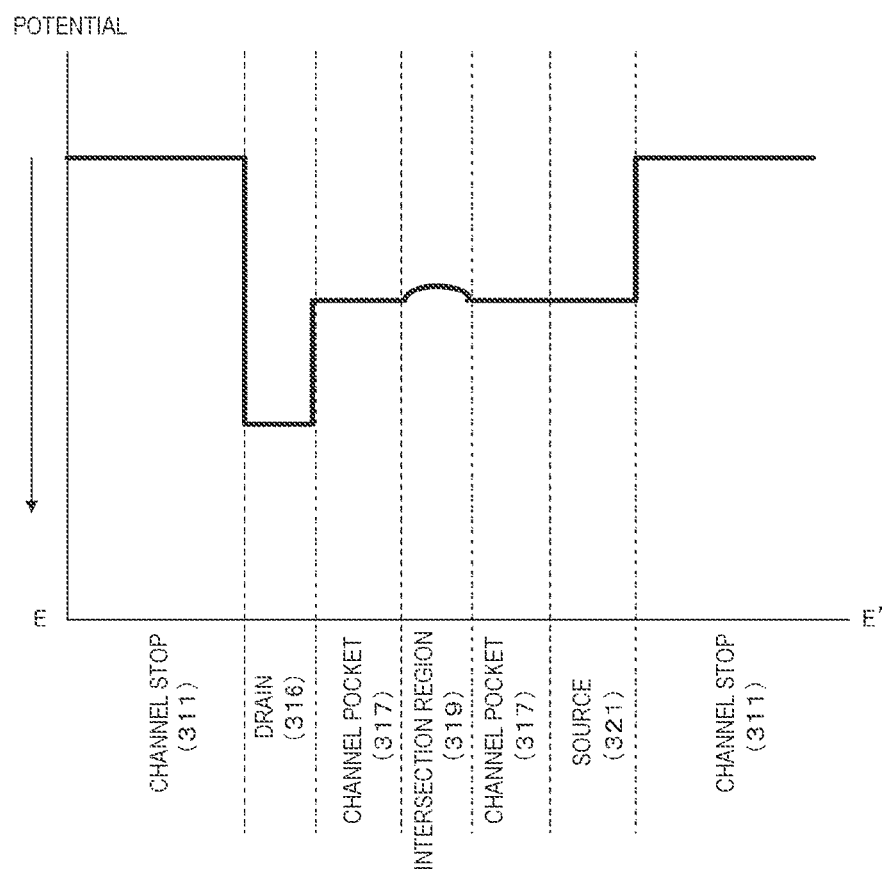
FIG. 19 is a potential diagram of the E-E' axis in the second embodiment.

FIG. 19 is a potential diagram of the E-E' axis in the second embodiment. The horizontal axis of FIG. 19 is the E-E' axis of FIG. 16, and the vertical axis is potential. In FIG. 19, the thick line indicates potential at the time of light exposure and resetting of the E-E' axis. As indicated by the thick line, the potential of the intersection region 319 is slightly lower than the potential of the channel pockets 317.

Figure 20:
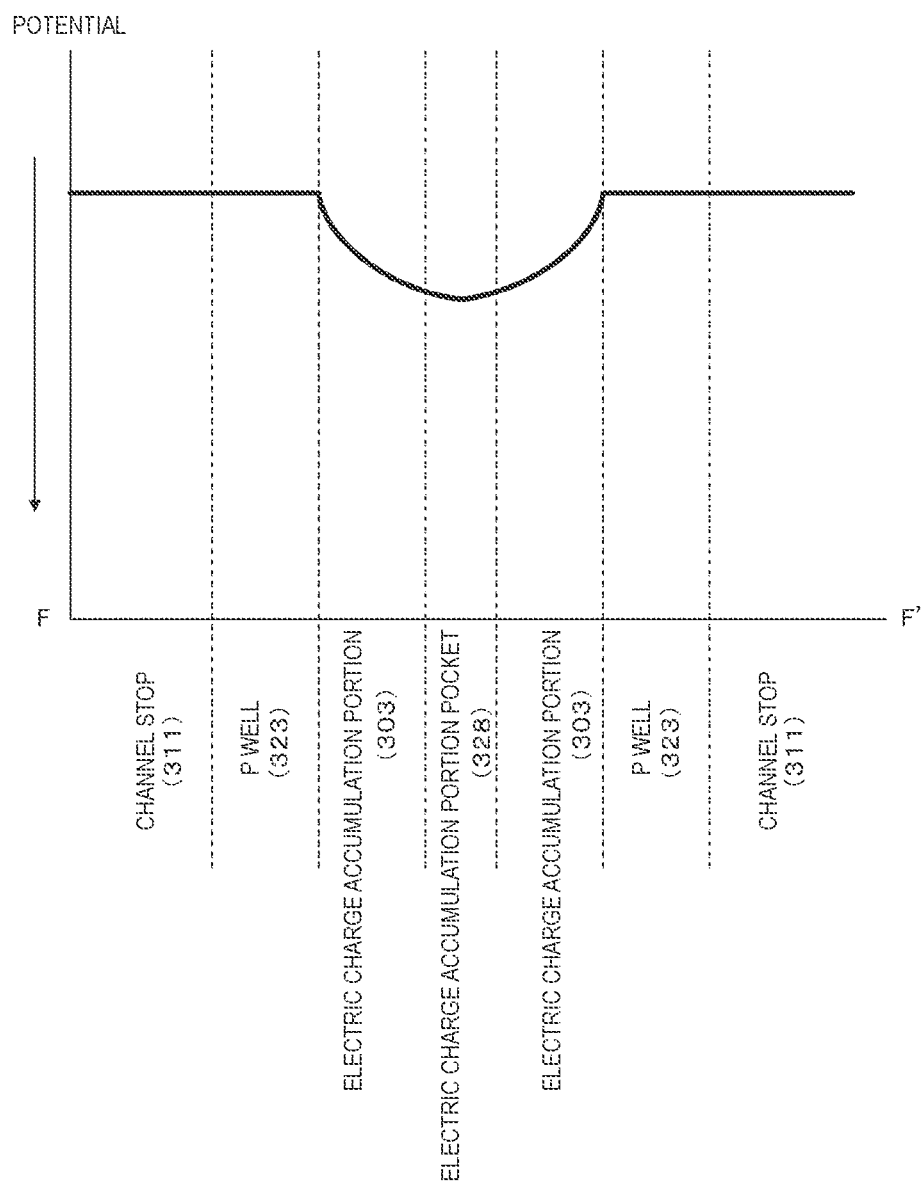
FIG. 20 is a potential diagram of the F-F' axis in the second embodiment.

FIG. 20 is a potential diagram of the F-F' axis in the second embodiment. The horizontal axis of FIG. 20 is the F-F' axis of FIG. 16, and the vertical axis is potential. In FIG. 20, the thick line indicates the potential at the time of light exposure and resetting of the F-F' axis. As indicated by this thick line, the potential of the electric charge accumulation portion pocket 328 is higher than the potential of the electric charge accumulation portion 303.

Noted that the potential diagram at G-G' time in the second embodiment is the same as the first embodiment.

As described above, according to the second embodiment, the reset gate and the reset drain are arranged in the X axis direction orthogonal to the direction from the source 321 to the drain 316, and thus resetting can be performed by applying an electric field in the X axis direction. Thereby, the reset control is simplified, and it is difficult for the unresetting to occur.

3. Third Embodiment

In the first embodiment, the JFET is provided as the control transistor 302, but a MOSFET can be provided as the control transistor 302. The pixel circuit 300 of the third embodiment is different from the first embodiment in that a MOSFET is provided as the control transistor 302.

Figure 21:
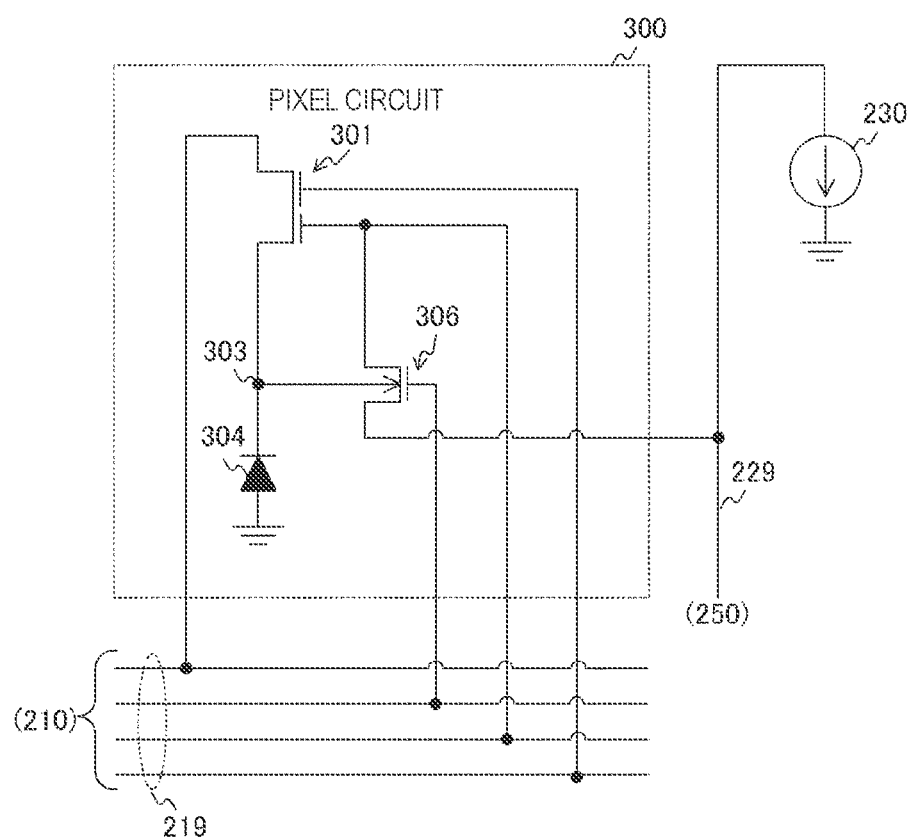
FIG. 21 is a circuit diagram illustrating one configuration example of a pixel circuit in a third embodiment.

FIG. 21 is a circuit diagram illustrating one configuration example of the pixel circuit 300 in the third embodiment. The pixel circuit 300 of the third embodiment is different from the first embodiment that a control transistor 306 of the MOSFET is included instead of the control transistor 302 of the JFET.

The back gate of the control transistor 306 is connected to the electric charge accumulation portion 303, and the gate is connected to the row scanning circuit 210. Connection between the source and the drain of the control transistor 306 is the same as the first embodiment. Also, the row scanning circuit 210 of the third embodiment applies a low-level potential to the gate of the control transistor 306 at the time of resetting, and applies a high-level potential at the time of light exposure. Note that the degree of modulation M1 and the conversion efficiency R1 of the third embodiment are obtained by expression 1 and expression 2, for example.

Although the N-type transistor is provided as the reset transistor 301 and the control transistor 306, a P-type transistor may be provided as the reset transistor 301 and the control transistor 306.

The row scanning circuit 210 of the third embodiment can supply a selection pulse for selecting the pixel circuit 300 to the gate of the control transistor 306. Therefore, an application for selecting pixels while maintaining a high conversion efficiency can be applied to a radiation detection apparatus 100. Here, a pulse period of a control pulse corresponds to a period for selecting a pixel, and a period from a reset pulse to an end of the control pulse corresponds to a light exposure period.

Figure 22:
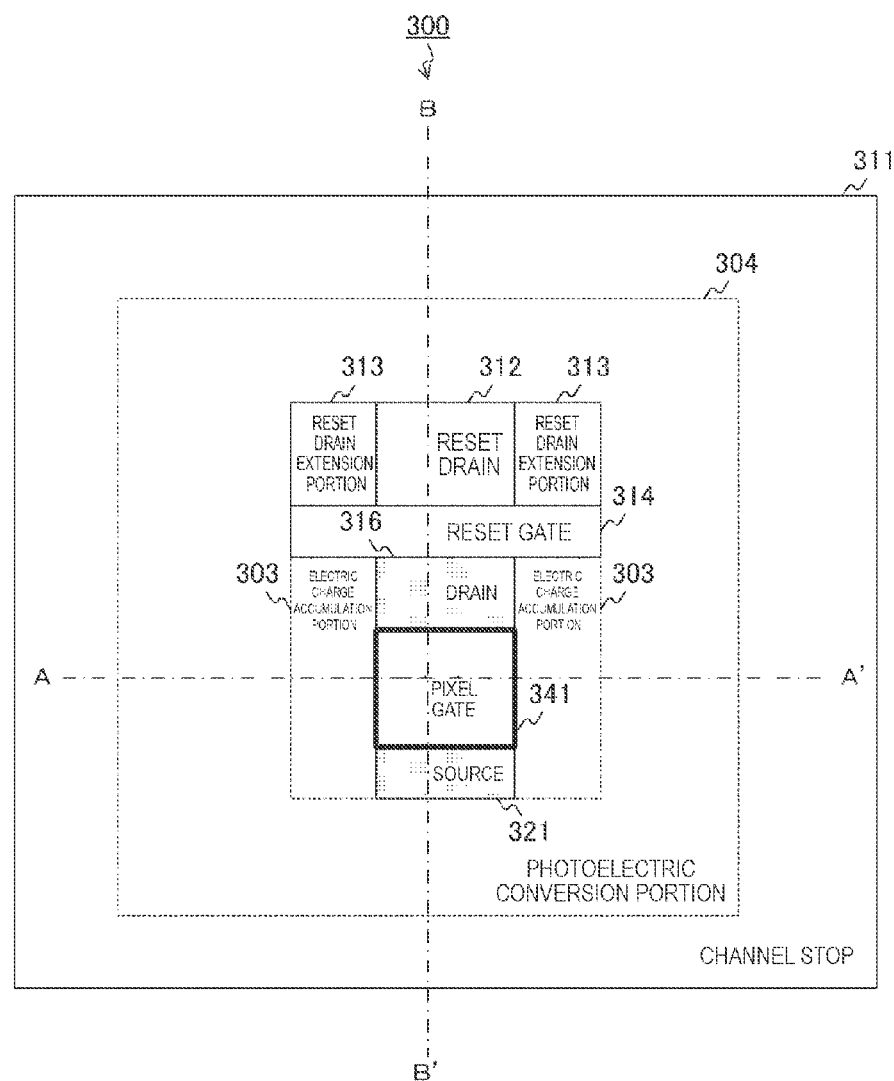
FIG. 22 is an example of a surface view of a pixel circuit in the third embodiment.

FIG. 22 is an example of a surface view of the pixel circuit 300 in the third embodiment. The pixel circuit 300 of the third embodiment is different from the first embodiment in that a pixel gate 341 is further provided between the drain 316 and the source 321. The pixel gate 341 corresponds to the gate of the control transistor 306.

Figure 23:
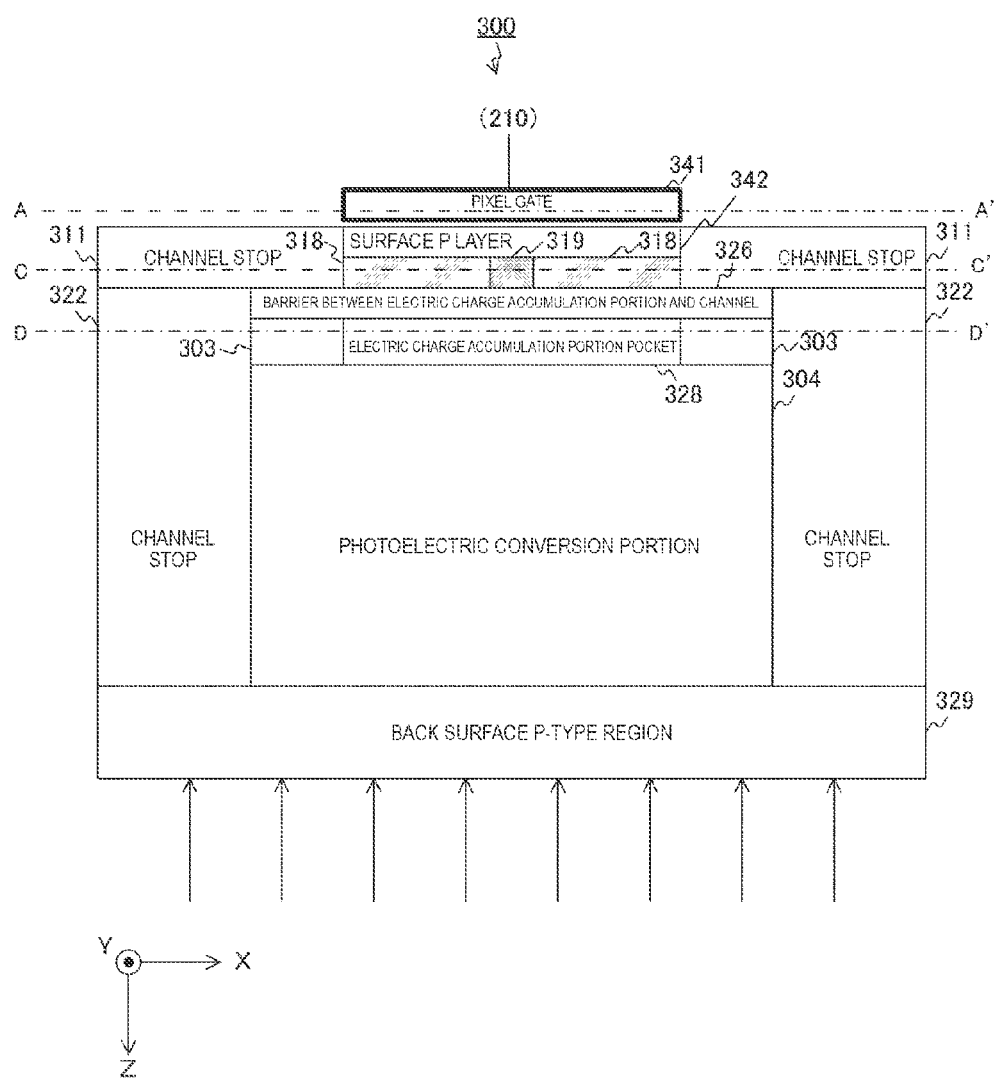
FIG. 23 is an example of a cross-sectional view along the X axis of a pixel circuit in the third embodiment.

FIG. 23 is an example of a cross-sectional view of the pixel circuit 300 along the A-A' axis of FIG. 22 parallel to the X axis in the third embodiment. The pixel circuit 300 of the third embodiment is different from the first embodiment in further including the pixel gate 341 and a surface P layer 342. The surface P layer 342 is provided on the channel barriers 318 and the intersection region 319, and the pixel gate 341 is provided above the surface P layer. Note that the configuration may be such that the surface P layer 342 is not provided.

Figure 24:
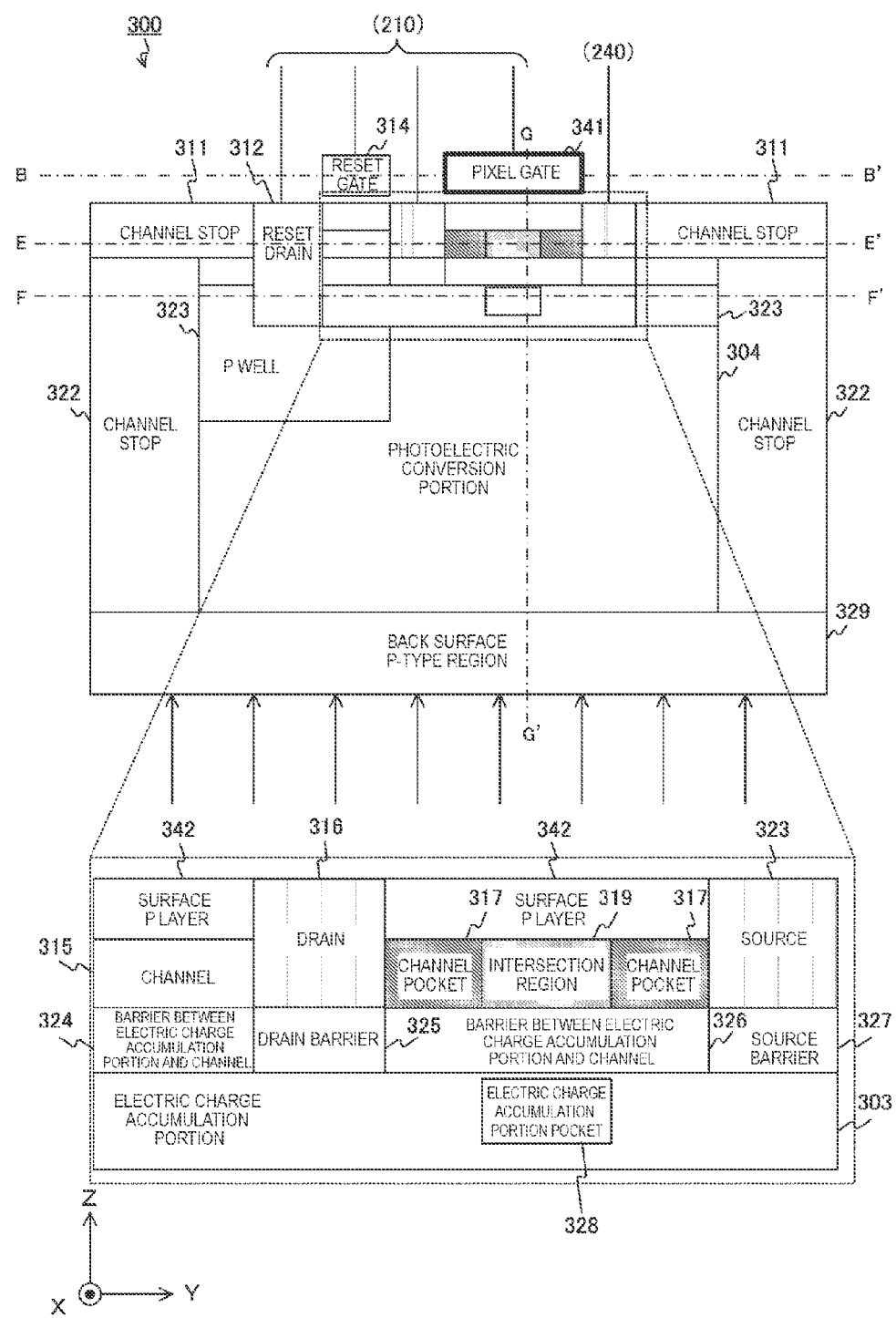
FIG. 24 is an example of a cross-sectional view along the Y axis of a pixel circuit in the third embodiment.

FIG. 24 is an example of a cross-sectional view of the pixel circuit 300 along the B-B' axis of FIG. 22 parallel to the Y axis in the third embodiment. The surface P layer 342 is provided on the channel pockets 317 and the intersection region 319, and the pixel gate 341 is provided above the surface P layer.

Figure 25:
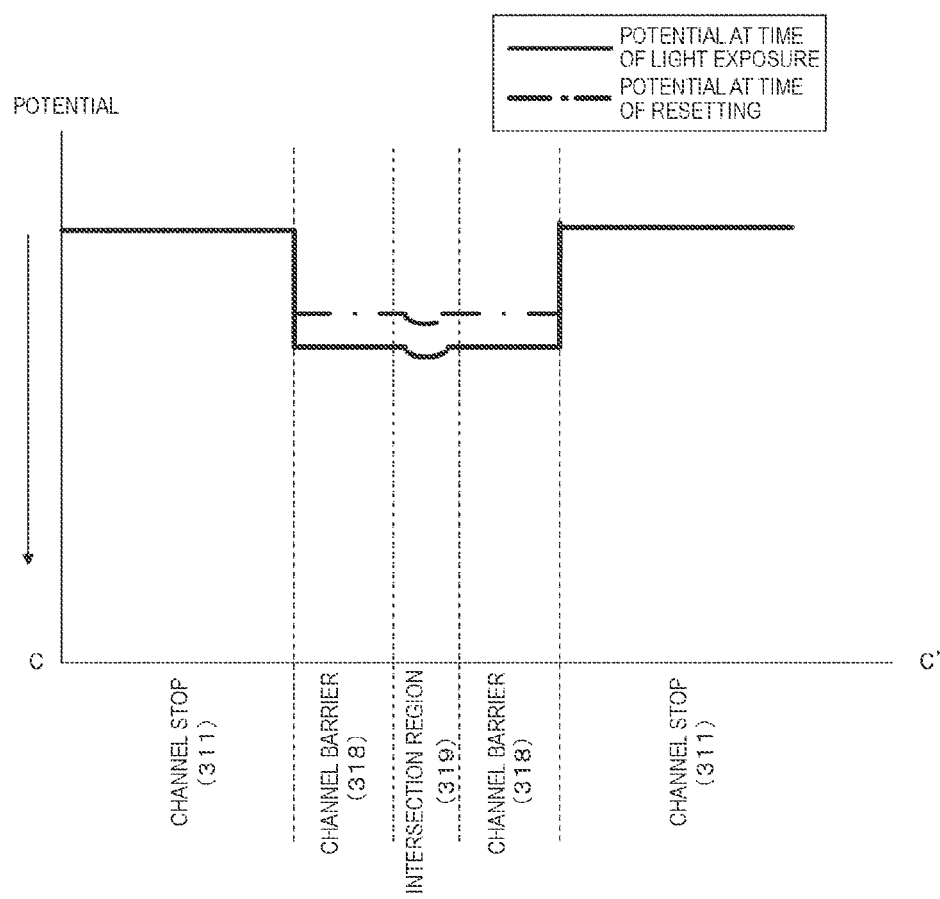
FIG. 25 is a potential diagram of the C-C' axis in the third embodiment.

FIG. 25 is a potential diagram of the C-C' axis in the third embodiment. The horizontal axis of FIG. 25 is the C-C' axis of FIG. 23, and the vertical axis is potential. In FIG. 25, the thick line indicates the potential at the time of light exposure of the C-C' axis, and the alternate long and short dashed line indicates the potential at the time of resetting of the C-C' axis. At the time of resetting, a low level potential is applied to the pixel gate 341, and the channel barriers 318 and the intersection region 319 right therebelow become low level. On the other hand, at the time of light exposure, a high-level potential is applied to the pixel gate 341, and the channel barriers 318 and the intersection region 319 right therebelow become high level.

Figure 26:
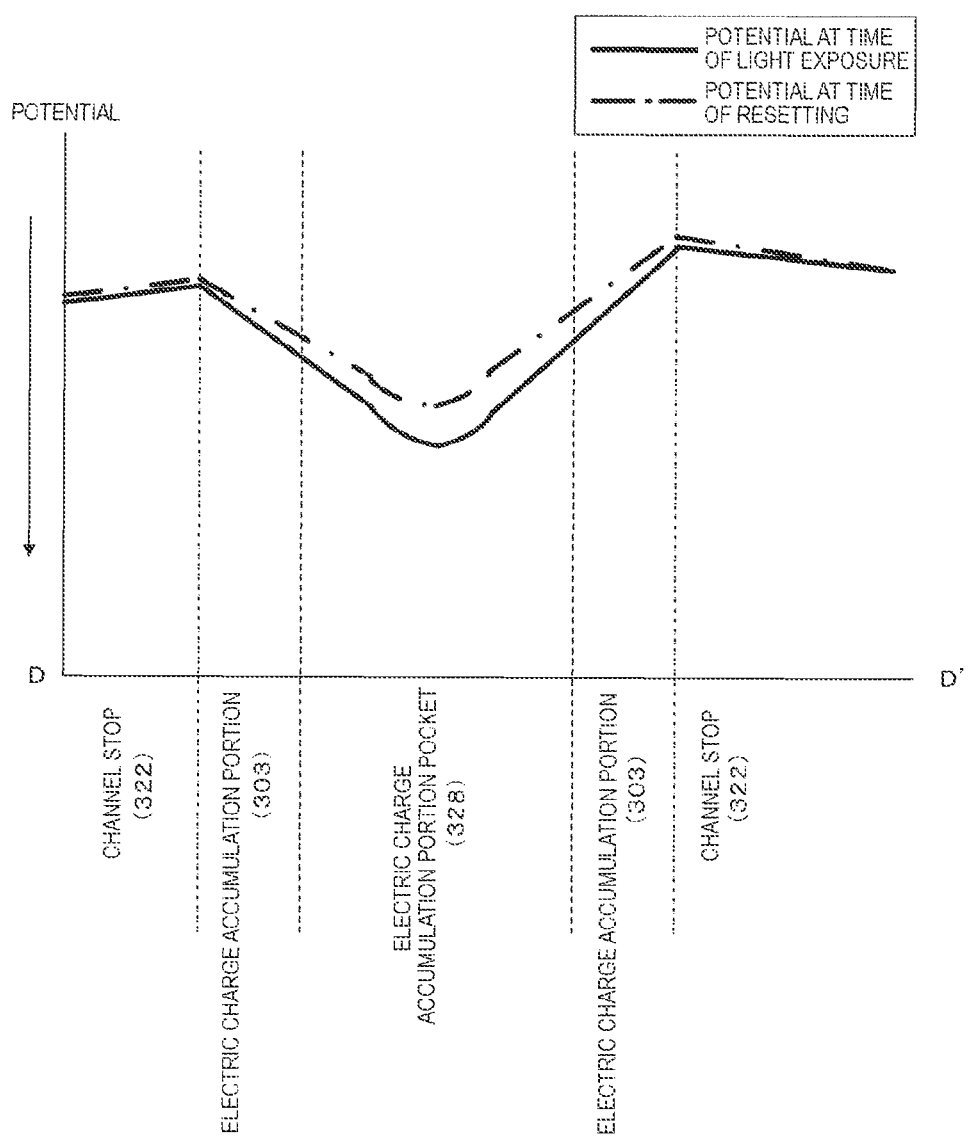
FIG. 26 is a potential diagram of the D-D' axis in the third embodiment.

FIG. 26 is a potential diagram of the D-D' axis in the third embodiment. The horizontal axis in FIG. 26 is the D-D' axis of FIG. 23, and the vertical axis is potential. In FIG. 26, the thick line indicates the potential at the time of light exposure of the D-D' axis, and the alternate long and short dashed line indicates the potential at the time of resetting of the D-D' axis. As illustrated in FIG. 26, at the time of resetting, a low level potential is applied to the pixel gate 341, and the electric charge accumulation portion 303 and the electric charge accumulation portion pocket 328 under the pixel gate 341 become low level. On the other hand, at the time of light exposure, a high-level potential is applied to the pixel gate 341, and the electric charge accumulation portion 303 and the electric charge accumulation portion pocket 328 under the pixel gate 341 become high level.

Figure 27:
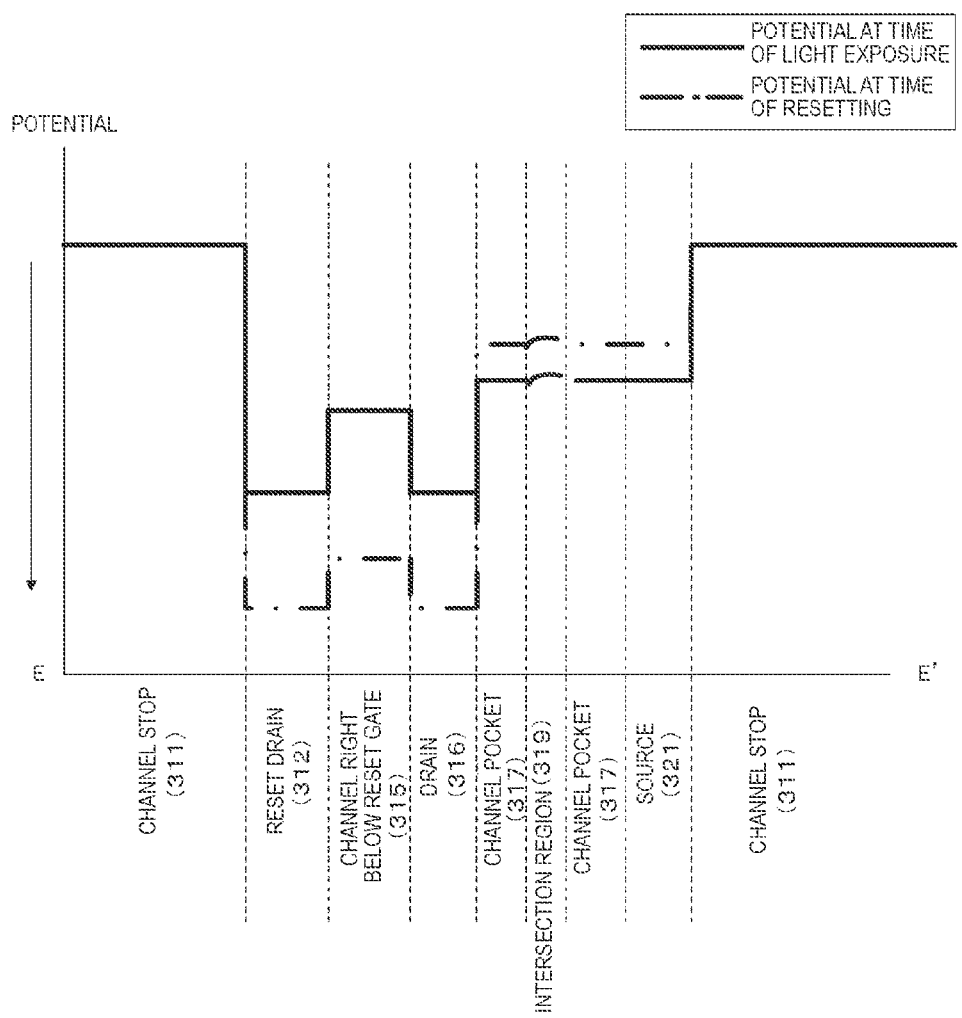
FIG. 27 is a potential diagram of the E-E' axis in the third embodiment.

FIG. 27 is a potential diagram of the E-E' axis in the third embodiment. The horizontal axis of FIG. 27 is the E-E' axis of FIG. 24, and the vertical axis is potential. In FIG. 27, the thick line indicates the potential at the time of light exposure of the E-E' axis and the alternate long and short dashed line indicates the potential at the time of resetting the E-E' axis. As illustrated in FIG. 27, at the time of resetting, a high level potential is applied to the reset drain 312, the reset gate 314, and the drain 316. Also, a low-level potential is applied to the pixel gate 341, and the potentials of the channel pockets 317 and the intersection region 319 become low level. On the other hand, at the time of light exposure, a low level potential is applied to the reset drain 312, the reset gate 314, and the drain 316. Also, a high-level potential is applied to the pixel gate 341, and the potentials of the channel pockets 317 and the intersection region 319 become high level.

Figure 28:
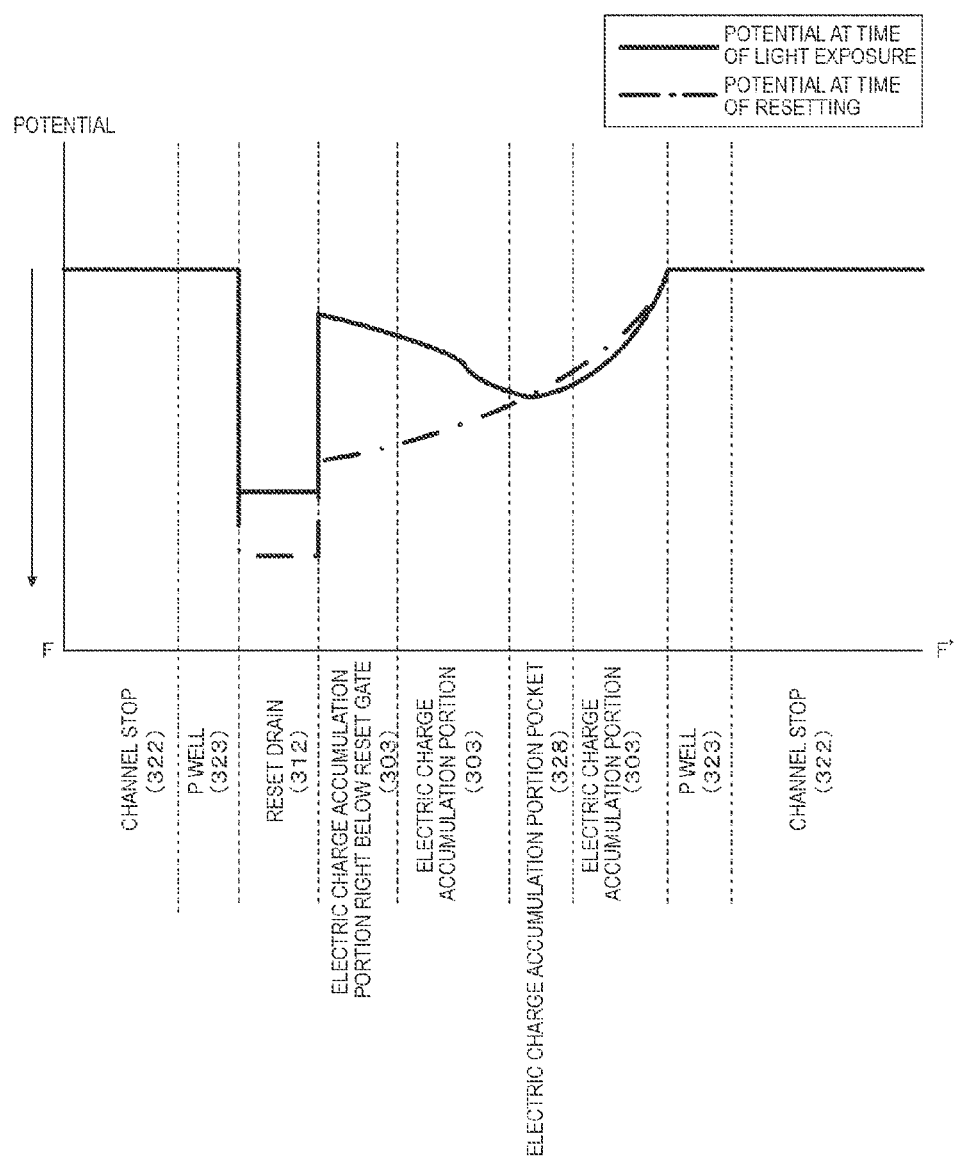
FIG. 28 is a potential diagram of the F-F' axis in the third embodiment.

FIG. 28 is a potential diagram of the F-F' axis in the third embodiment. The horizontal axis of FIG. 28 is the F-F' axis of FIG. 24, and the vertical axis is potential. In FIG. 28, the thick line indicates the potential at the time of light exposure of the F-F' axis, and the alternate long and short dashed line indicates the potential at the time of resetting of the F-F' axis. As illustrated in FIG. 28, at the time of resetting, a high level potential is applied to the reset drain 312 and the reset gate 314. On the other hand, at the time of light exposure, a low level potential is applied to the reset drain 312 and the reset gate 314.

Figure 29:
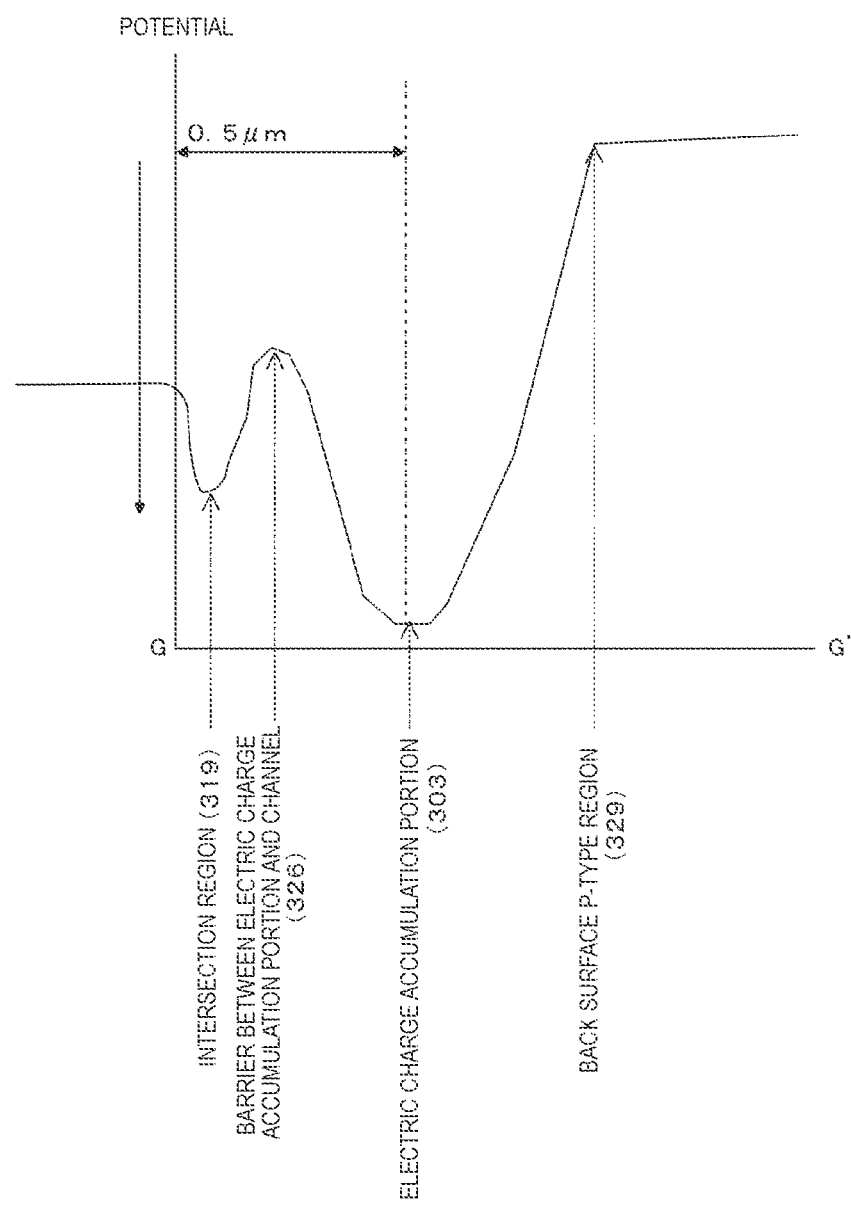
FIG. 29 is a potential diagram of the G-G' axis in the third embodiment.

FIG. 29 is a potential diagram of the G-G' axis in the third embodiment. The horizontal axis in FIG. 29 is the G-G' axis in FIG. 24, and the vertical axis is potential. The depth from the surface of the channels 320 of the third embodiment is 0.2 micrometer (μm), for example. Also, the depth of the barrier between electric charge accumulation portion and channel 326 and the electric charge accumulation portion 303 of the third embodiment is the same as the first embodiment.

As described above, according to the third embodiment, the MOSFET is provided as the control transistor, and thereby the row scanning circuit 210 can further supply the selection pulse for selecting pixels.

4. Fourth Embodiment

Although the reset transistor 301 applies an electric field in the Y-axis direction (the direction from the source 321 to the drain 316) in the third embodiment, the electric field can be applied in the X-axis direction. The pixel circuit 300 of the fourth embodiment is different from the third embodiment in that the reset transistor applies an electric field in the X axis direction.

Figure 30:
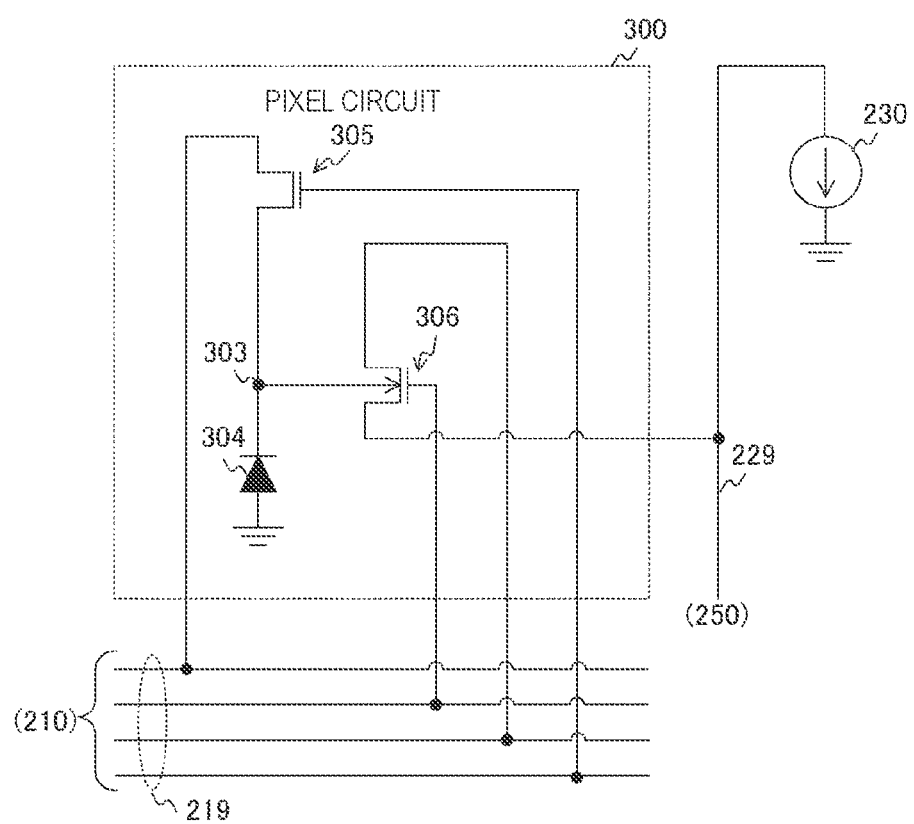
FIG. 30 is a circuit diagram illustrating one configuration example of a pixel circuit in a fourth embodiment.

FIG. 30 is a circuit diagram illustrating one configuration example of the pixel circuit 300 in the fourth embodiment. The pixel circuit 300 of the fourth embodiment is different from the third embodiment in that a reset transistor 305 is included instead of the reset transistor 301. The configuration of the reset transistor 305 is the same as the reset transistor of the second embodiment. Although the N-type transistor is provided as the reset transistor 305 and the control transistor 306, a P-type transistor may be provided as the reset transistor 305 and the control transistor 306.

Figure 31:
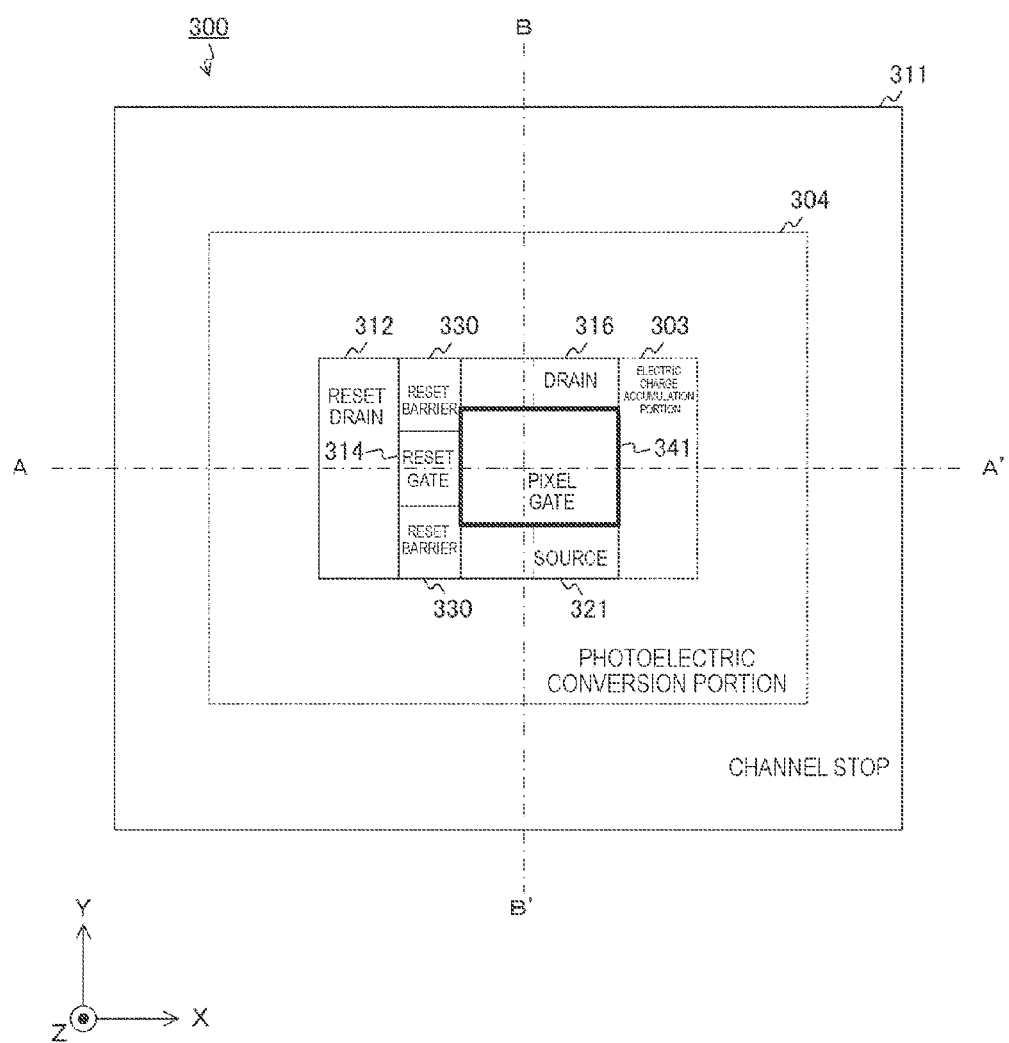
FIG. 31 is an example of a surface view of a pixel circuit in the fourth embodiment.

FIG. 31 is an example of a surface view of the pixel circuit 300 in the fourth embodiment. The reset gate 314 of the fourth embodiment is provided at a position adjacent to the channels 320 and the channel barriers 318 in the X axis direction. Also, the reset barriers 330 are further provided on both sides of the reset gate 314 in the Y axis direction. Also, the reset drain 312 of the fourth embodiment is provided on a side not adjacent to the channels 320 of both sides of the reset gate 314 in the X axis direction.

Figure 32:
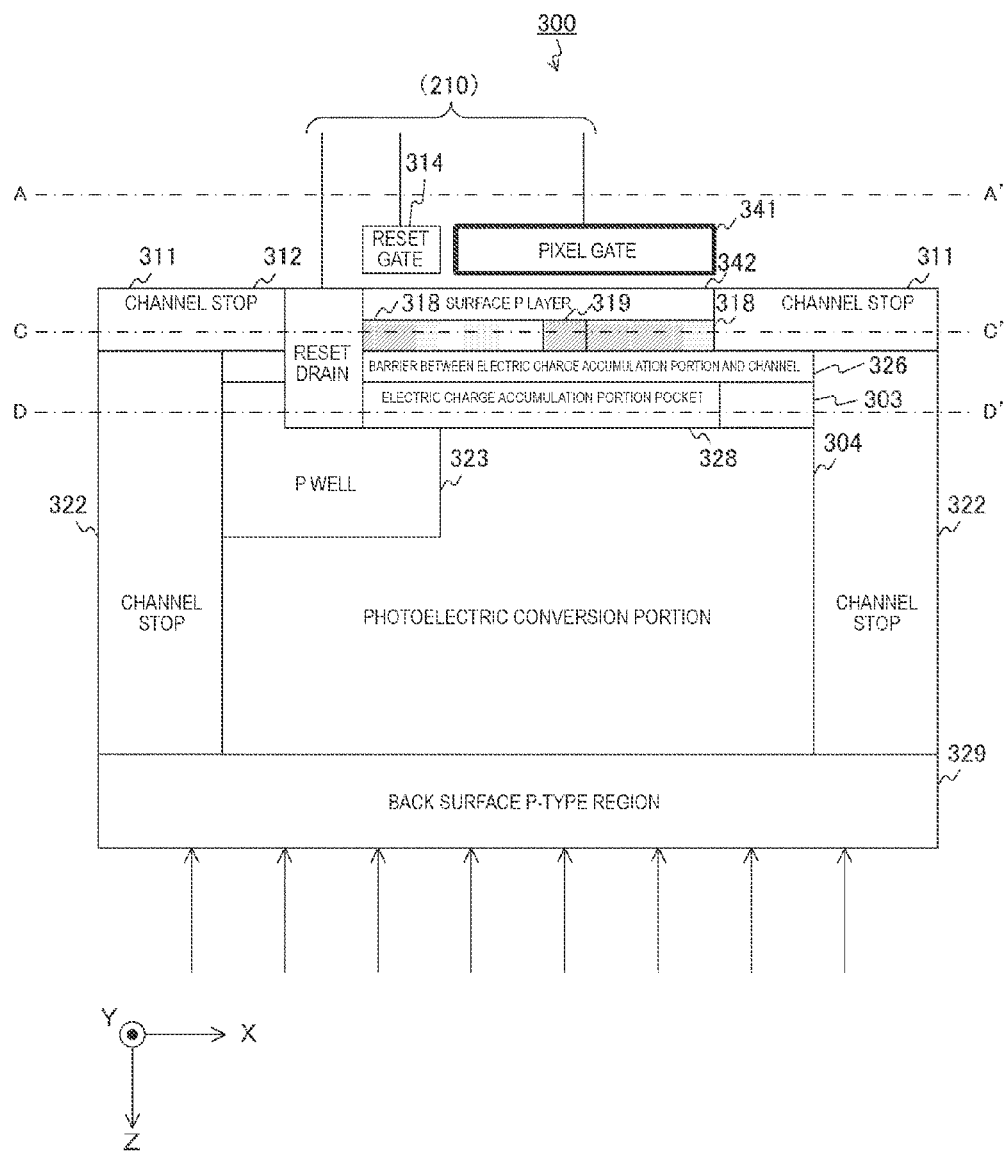
FIG. 32 is an example of a cross-sectional view along the X axis of a pixel circuit in the fourth embodiment.

FIG. 32 is an example of a cross-sectional view of the pixel circuit 300 along the A-A' axis of FIG. 30 parallel to the X axis in the fourth embodiment. The surface P layer 342 is provided on the channel barriers 318 and the intersection region 319 of the fourth embodiment in the same way as the third embodiment, and the pixel gate 341 is provided above the surface P layer 342. Also, in the fourth embodiment, the configuration other than the pixel gate 341 and the surface P layer 342 is the same as the second embodiment.

Figure 33:
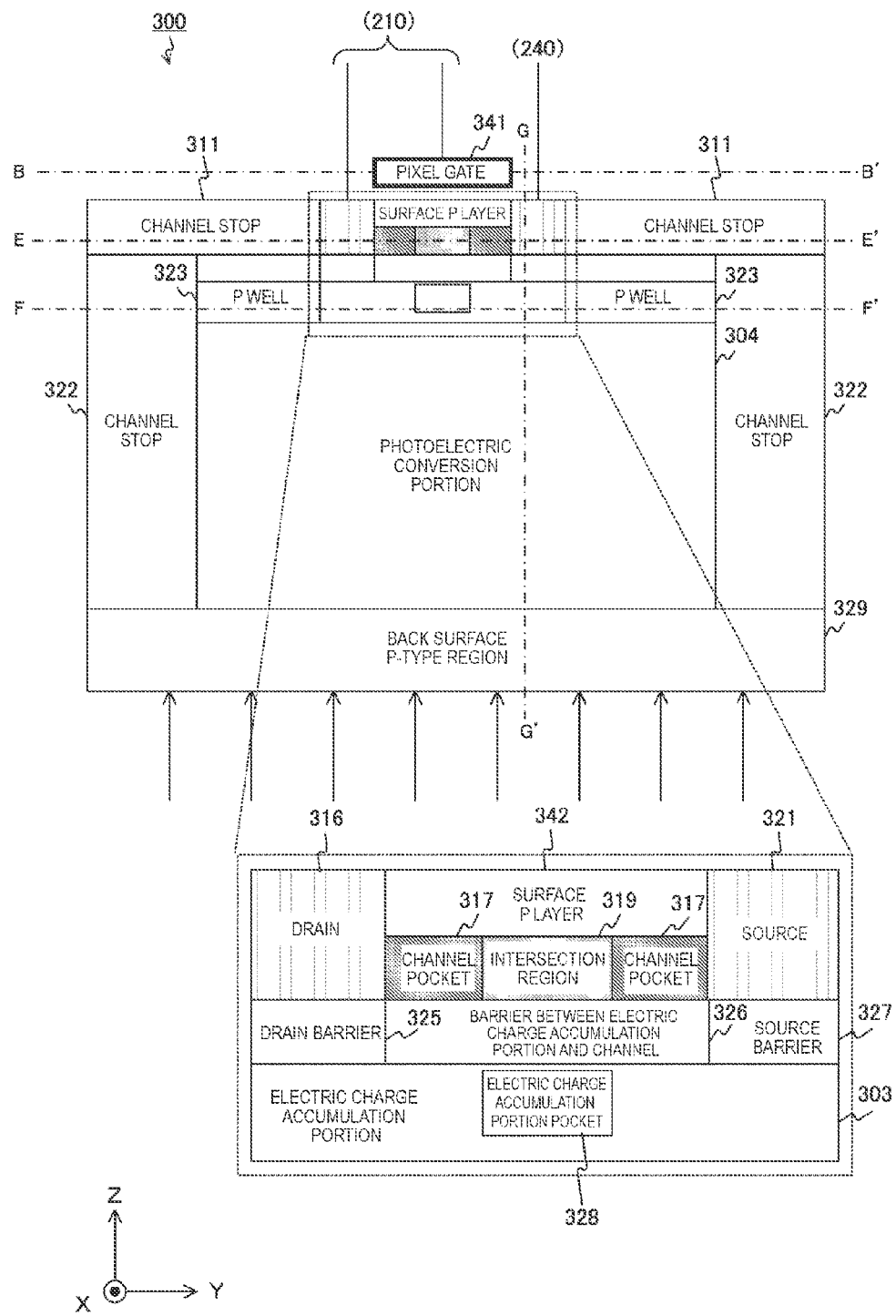
FIG. 33 is an example of a cross-sectional view along the Y axis of a pixel circuit in the fourth embodiment.

FIG. 33 is an example of a cross-sectional view of the pixel circuit 300 along the B-B' axis of FIG. 30 parallel to the Y axis in the fourth embodiment. The surface P layer 342 is provided on the channel pockets 317 and the intersection region 319 of the fourth embodiment in the same way the third embodiment, and the pixel gate 341 is provided above the surface P layer 342. Also, in the fourth embodiment, the configuration other than the pixel gate 341 and the surface P layer 342 is the same as the second embodiment.

Figure 34:
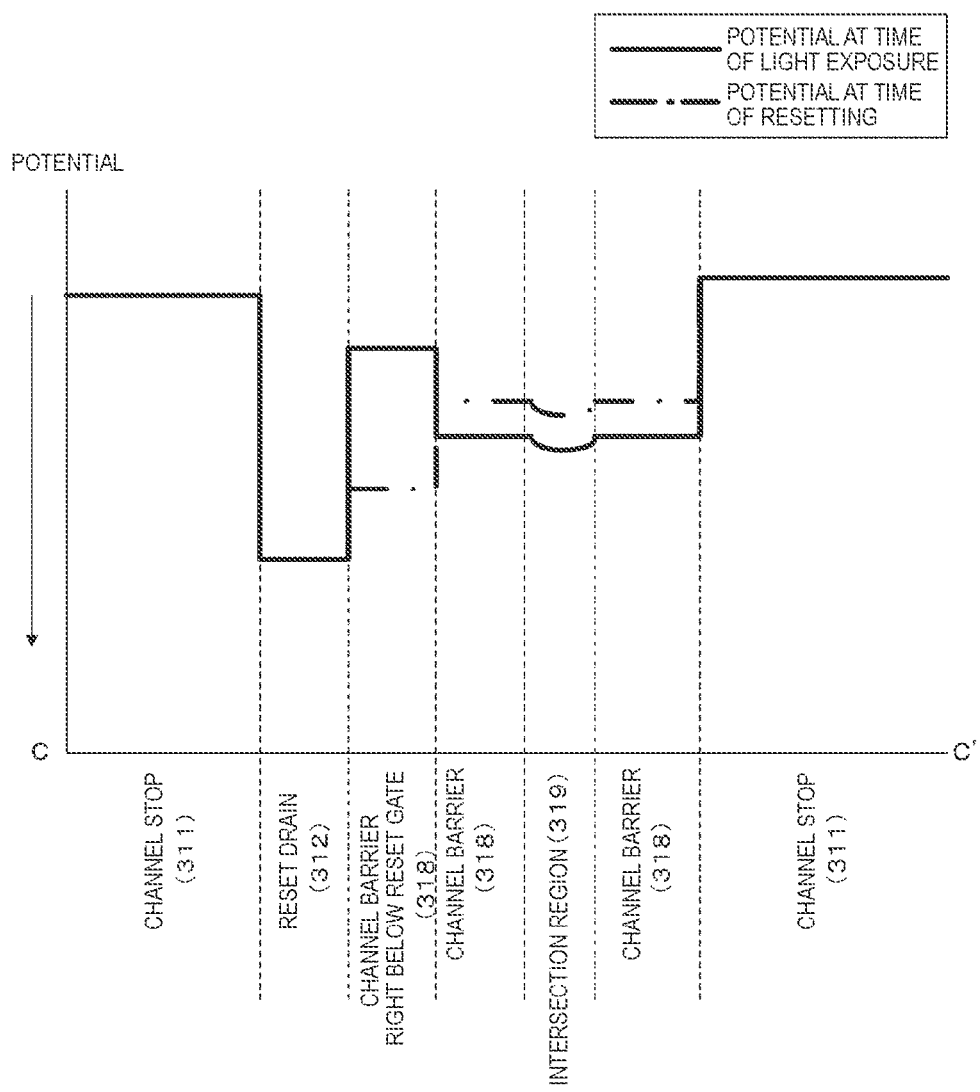
FIG. 34 is a potential diagram of the C-C' axis in the fourth embodiment.

FIG. 34 is a potential diagram of the C-C' axis in the fourth embodiment. The horizontal axis of FIG. 34 is the C-C' axis of FIG. 32, and the vertical axis is potential. In FIG. 34, the thick line indicates the potential at the time of light exposure of the C-C' axis, and the alternate long and short dashed line indicates the potential at the time of resetting of the C-C' axis. As illustrated in FIG. 34, at the time of resetting, a high level potential is applied to the reset gate 314, and a low level potential is applied to the pixel gate 341, and the potentials of the channel barriers 318 and the intersection region 319 become low level. On the other hand, at the time of light exposure, a low level potential is applied to the reset gate 314, and a high level potential is applied to the pixel gate 341, and the potentials of the channel barriers 318 and the intersection region 319 become high level.

Figure 35:
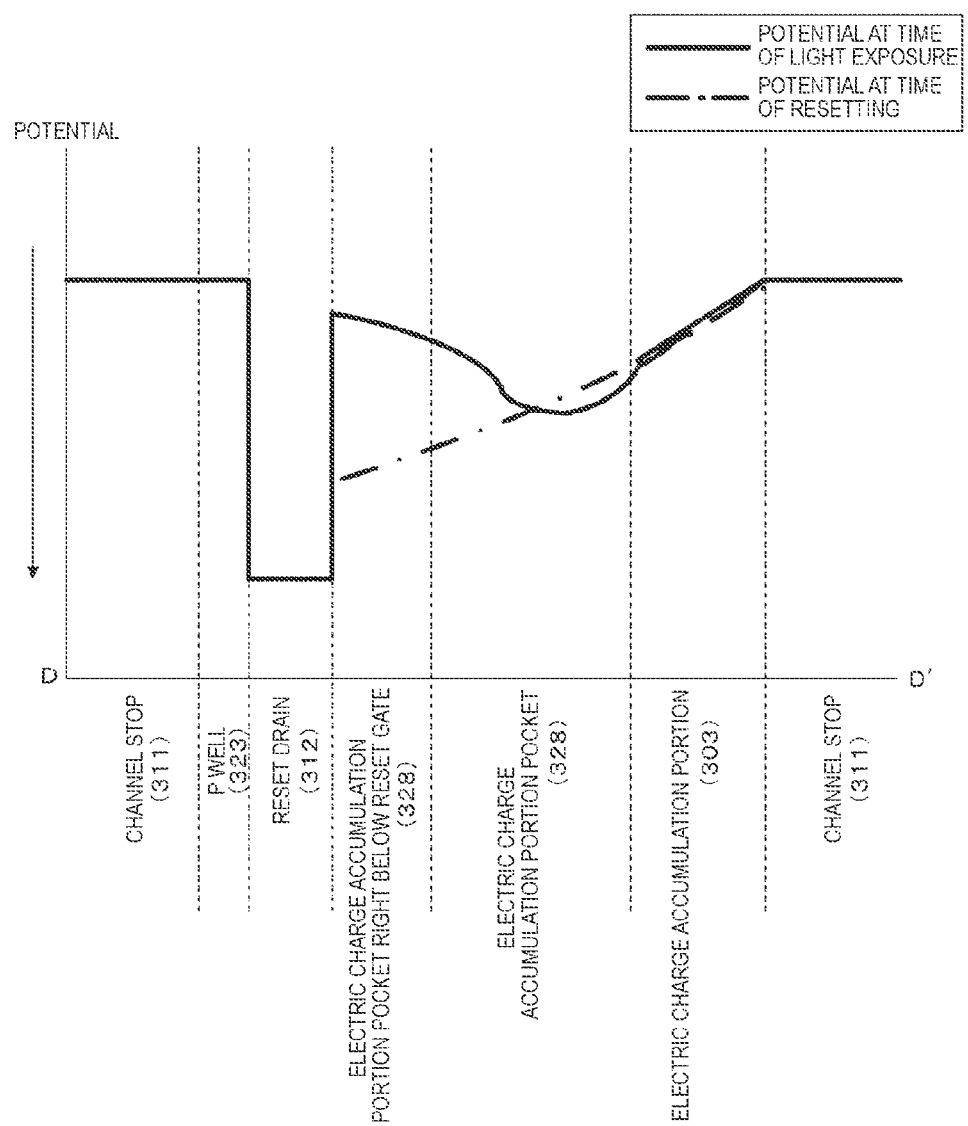
FIG. 35 is a potential diagram of the D-D' axis in the fourth embodiment.

FIG. 35 is a potential diagram of the D-D' axis in the fourth embodiment. The horizontal axis of FIG. 35 is the D-D' axis of FIG. 32, and the vertical axis is potential. In FIG. 35, the thick line indicates the potential at the time of light exposure of the D-D' axis, and the alternate long and short dashed line indicates the potential at the time of resetting of the D-D' axis. As illustrated in FIG. 35, a high level potential is applied to the reset gate 314 at the time of resetting, and a low level potential is applied to the reset gate 314 at the time of light exposure.

Figure 36:
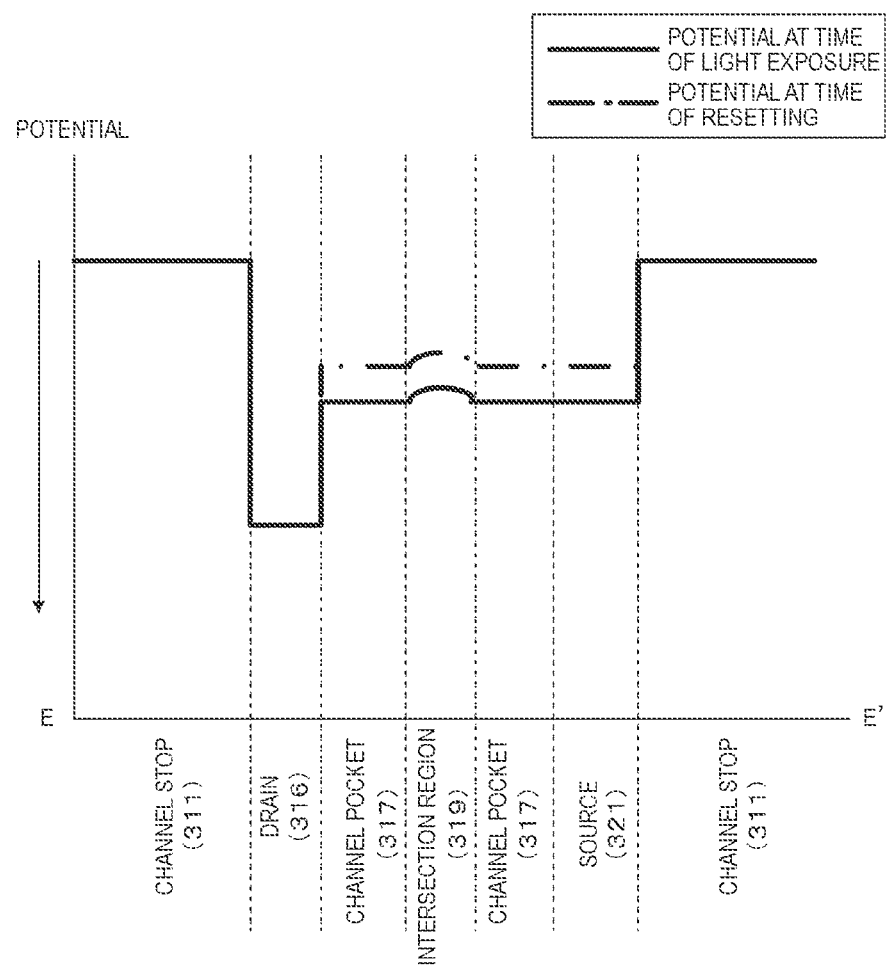
FIG. 36 is a potential diagram of the E-E' axis in the fourth embodiment.

FIG. 36 is a potential diagram of the E-E' axis in the fourth embodiment. The horizontal axis in FIG. 36 is the E-E' axis in FIG. 33, and the vertical axis is potential. In FIG. 36, the thick line indicates the potential at the time of light exposure and resetting of the E-E' axis. As illustrated in FIG. 36, at the time of resetting, a low level potential is applied to the pixel gate 341, and the potentials of the channel pockets 317 and the intersection region 319 become low level. On the other hand, at the time of light exposure, a high-level potential is applied to the pixel gate 341, and the potentials of the channel pockets 317 and the intersection region 319 become high level.

Figure 37:
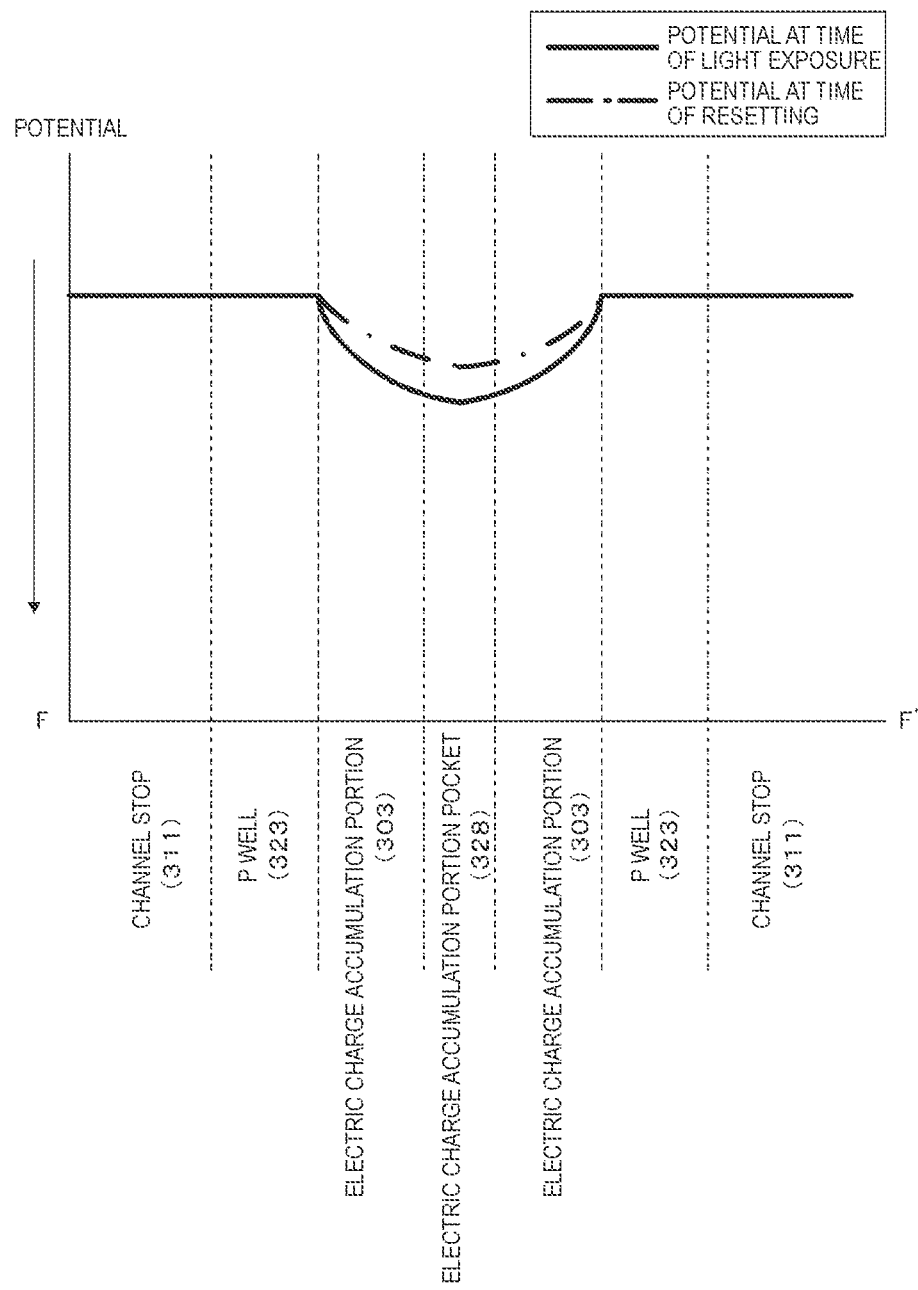
FIG. 37 is a potential diagram of the F-F' axis in the fourth embodiment.

FIG. 37 is a potential diagram of the F-F' axis in the fourth embodiment. The horizontal axis of FIG. 37 is the F-F' axis of FIG. 33, and the vertical axis is potential. In FIG. 37, the thick line indicates the potential at the time of light exposure of the F-F' axis, and the alternate long and short dashed line indicates the potential at the time of resetting of the F-F' axis. As illustrated in FIG. 37, at the time of resetting, a low level potential is applied to the pixel gate 341, and the electric charge accumulation portion 303 and the electric charge accumulation portion pocket 328 under the pixel gate 341 become low level. On the other hand, at the time of light exposure, a high-level potential is applied to the pixel gate 341, and the electric charge accumulation portion 303 and the electric charge accumulation portion pocket 328 under the pixel gate 341 become high level.

Noted that the potential diagram at G-G' time in the fourth embodiment is the same as the third embodiment.

As described above, according to the fourth embodiment, the MOSFET is provided as the control transistor, and the reset gate and the reset drain are arranged in the X axis direction, and thus it is possible to reset by applying an electric field in the X axis direction and to supply a selection pulse.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

In addition, the effects described in the present specification are not limiting but are merely examples, and there may be additional effects.

Additionally, the present technology may also be configured as below.

(1)
A pixel circuit including:
a photoelectric conversion portion that converts light incident along an optical axis to electric charge;
a control transistor that controls an output voltage according to an input voltage; and
an electric charge accumulation portion that accumulates electric charge in a region positioned between the control transistor and the photoelectric conversion portion on the optical axis, and supplies a voltage according to an accumulated electric charge amount as the input voltage to the control transistor.

(2)
The pixel circuit according to (1), wherein
the output voltage is a voltage between a source and a drain of the control transistor, and
the electric charge accumulation portion accumulates the electric charge in the region positioned between the source and the drain and the photoelectric conversion portion on the optical axis.

(3)
The pixel circuit according to (1) or (2), wherein
the electric charge accumulation portion has a larger area than the control transistor in a plane perpendicular to the optical axis.

(4)
The pixel circuit according to any of (1) to (3), wherein
the control transistor is a junction field effect transistor.

(5)
The pixel circuit according to any of (1) to (3), wherein
the control transistor is a metal-oxide-semiconductor (MOS) field-effect transistor.

(6)
The pixel circuit according to (1), further including:
a reset transistor that sets the electric charge amount to an initial value by applying a predetermined potential to a reset gate and a reset drain provided on a plane perpendicular to the optical axis.

(7)
The pixel circuit according to (6), wherein
the reset gate and the reset drain are arranged along a direction from a source of the control transistor to a drain of the control transistor.

(8)
The pixel circuit according to (6), wherein
the reset gate and the reset drain are arranged along a direction orthogonal to a direction from a source of the control transistor to a drain of the control transistor.

(9)
The pixel circuit according to any of (6) to (8), wherein
the reset gate and a channel of the control transistor are formed according to a same impurity profile.

(10)
The pixel circuit according to any of (6) to (9), wherein
the reset gate is adjacent to the electric charge accumulation portion.

(11)
The pixel circuit according to any of (1) to (10), wherein
the control transistor includes
a source and a drain,
a channel provided between the source and the drain, and
a channel pocket formed along a direction from the drain to the source between the source and the drain,
wherein a potential of the channel pocket is higher than a potential of the channel.

(12)
The pixel circuit according to any of (1) to (11), wherein
the control transistor includes
a source and a drain,
a channel provided between the source and the drain, and
a channel barrier formed along a direction orthogonal to a direction from the drain to the source between the source and the drain,
wherein a potential of the channel barrier is lower than a potential of the channel.

(13)
The pixel circuit according to any of (1) to (12), further including:
an electric charge accumulation portion pocket whose potential is higher than a potential of the electric charge accumulation portion,
wherein the electric charge accumulation portion pocket is provided along a direction orthogonal to a direction from the drain to the source in a region surrounded by the electric charge accumulation portion.

(14)
The pixel circuit according to any of (1) to (13), wherein
a channel of the control transistor and the electric charge accumulation portion are separated by a barrier between the electric charge accumulation portion and the channel, to which an impurity having a smaller diffusion coefficient than an impurity of the channel is added.

(15)
A pixel circuit according to (14), wherein
the impurity added to the barrier between the electric charge accumulation portion and the channel is indium.

(16)
The pixel circuit according to (14), wherein
the impurity added to the barrier between the electric charge accumulation portion and the channel is arsenic.

(17)
An imaging apparatus including:
an image sensor including, with respect to each pixel, a photoelectric conversion portion that converts light incident along an optical axis to electric charge, a control transistor that controls an output voltage according to an input voltage, and an electric charge accumulation portion that accumulates electric charge in a region positioned between the control transistor and the photoelectric conversion portion on the optical axis and supplies a voltage according to an accumulated electric charge amount as the input voltage to the control transistor; and
a signal processing unit that processes an electric signal of the output voltage.

REFERENCE SIGNS LIST 100 imaging apparatus
110 lens
120 signal processing unit
130 drive circuit
200 image sensor
210 row scanning circuit
220 pixel array unit
230 constant current circuit
240 sense circuit unit
250 sense circuit
260 determination result integration circuit unit
261, 262 determination result integration circuit
271, 272 register
281, 282 count circuit
291, 292 memory
300 pixel circuit
301, 305, 331 reset transistor
302, 306, 332 control transistor
303 electric charge accumulation portion
304 photoelectric conversion portion
311, 322 channel stop
312 reset drain
313 reset drain extension portion
314 reset gate
315, 320 channel
316 drain
317 channel pocket
318 channel barrier
319 intersection region
321 source
323 P well
324, 326 barrier between electric charge accumulation portion and channel
325 drain barrier
327 source barrier
328 electric charge accumulation portion pocket
329 back surface P-type region
330 reset barrier
341 pixel gate
342 surface P layer

What is claimed is:

1. A pixel circuit comprising:
a photoelectric conversion portion that converts light incident along an optical axis to electric charge;
a control transistor that controls an output voltage according to an input voltage; and
an electric charge accumulation portion that accumulates electric charge in a region positioned between the control transistor and the photoelectric conversion portion on the optical axis, and supplies a voltage according to an accumulated electric charge amount as the input voltage to the control transistor,
wherein a barrier is disposed between a channel of the control transistor and the electric charge accumulation portion.

2. The pixel circuit according to claim 1, wherein
the output voltage is a voltage between a source and a drain of the control transistor, and
the electric charge accumulation portion accumulates the electric charge in the region positioned between the source and the drain and the photoelectric conversion portion on the optical axis.

3. The pixel circuit according to claim 1, wherein the electric charge accumulation portion has a larger area than the control transistor in a plane perpendicular to the optical axis.

4. The pixel circuit according to claim 1, wherein the control transistor is a junction field effect transistor.

5. The pixel circuit according to claim 1, wherein the control transistor is a metal-oxide-semiconductor (MOS) field-effect transistor.

6. The pixel circuit according to claim 1, further comprising:
a reset transistor that sets the electric charge amount to an initial value by applying a predetermined potential to a reset gate and a reset drain provided on a plane perpendicular to the optical axis.

7. The pixel circuit according to claim 6, wherein the reset gate and the reset drain are arranged along a direction from a source of the control transistor to a drain of the control transistor.

8. The pixel circuit according to claim 6, wherein the reset gate and the reset drain are arranged along a direction orthogonal to a direction from a source of the control transistor to a drain of the control transistor.

9. The pixel circuit according to claim 6, wherein the reset gate is adjacent to the electric charge accumulation portion.

10. The pixel circuit according to claim 1, wherein the control transistor includes:
a source and a drain,
the channel positioned between the source and the drain, and
a channel pocket formed along a direction from the drain to the source between the source and the drain,
wherein a potential of the channel pocket is higher than a potential of the channel.

11. The pixel circuit according to claim 1, wherein the control transistor includes:
a source and a drain,
the channel positioned between the source and the drain, and
a channel barrier formed along a direction orthogonal to a direction from the drain to the source between the source and the drain,
wherein a potential of the channel barrier is lower than a potential of the channel.

12. The pixel circuit according to claim 1, further comprising:
an electric charge accumulation portion pocket whose potential is higher than a potential of the electric charge accumulation portion,
wherein the electric charge accumulation portion pocket is provided along a direction orthogonal to a direction from the drain to the source in a region surrounded by the electric charge accumulation portion.

13. The pixel circuit according to claim 1, wherein an impurity having a smaller diffusion coefficient than an impurity of the channel is added to the barrier.

14. A pixel circuit according to claim 13, wherein the impurity added to the barrier between the electric charge accumulation portion and the channel is indium.

15. The pixel circuit according to claim 13, wherein the impurity added to the barrier between the electric charge accumulation portion and the channel is arsenic.

16. An imaging apparatus comprising:
an image sensor including, with respect to each pixel, a photoelectric conversion portion that converts light incident along an optical axis to electric charge, a control transistor that controls an output voltage according to an input voltage, and an electric charge accumulation portion that accumulates electric charge in a region positioned between the control transistor and the photoelectric conversion portion on the optical axis and supplies a voltage according to an accumulated electric charge amount as the input voltage to the control transistor, wherein a barrier is disposed between a channel of the control transistor and the electric charge accumulation portion; and
a signal processing unit that processes an electric signal of the output voltage.

17. The imaging apparatus according to claim 16, wherein
the output voltage is a voltage between a source and a drain of the control transistor, and
the electric charge accumulation portion accumulates the electric charge in the region positioned between the source and the drain and the photoelectric conversion portion on the optical axis.

18. The imaging apparatus according to claim 16, wherein the electric charge accumulation portion has a larger area than the control transistor in a plane perpendicular to the optical axis.

19. The imaging apparatus according to claim 16, wherein the control transistor is a junction field effect transistor.

20. The imaging apparatus according to claim 16, wherein the control transistor is a metal-oxide-semiconductor (MOS) field-effect transistor.

* * * * *